US006956266B1

(12) United States Patent
Voldman et al.

(10) Patent No.: US 6,956,266 B1
(45) Date of Patent: Oct. 18, 2005

(54) STRUCTURE AND METHOD FOR LATCHUP SUPPRESSION UTILIZING TRENCH AND MASKED SUB-COLLECTOR IMPLANTATION

(75) Inventors: Steven H. Voldman, South Burlington, VT (US); Anne E. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,300

(22) Filed: Sep. 9, 2004

(51) Int. Cl.[7] .................. H01L 29/76; H01L 29/94; H01L 31/062; H01L 31/113; H01L 31/119
(52) U.S. Cl. .................. 257/371; 257/372; 257/347
(58) Field of Search ................ 257/371, 372, 257/347, 336, 344, 330, 332

(56) References Cited

U.S. PATENT DOCUMENTS

| | | | |
|---|---|---|---|
| 4,486,266 A | 12/1984 | Yamaguchi | |
| 4,578,128 A | 3/1986 | Mundt et al. | |
| 4,656,730 A | 4/1987 | Lynch et al. | |
| 4,729,006 A | 3/1988 | Dally et al. | |
| 4,862,233 A | 8/1989 | Matsushita et al. | |
| 4,881,105 A * | 11/1989 | Davari et al. | 257/334 |
| 4,926,233 A | 5/1990 | Hutter | |
| 5,021,355 A * | 6/1991 | Dhong et al. | 257/E21.143 |
| 5,029,321 A * | 7/1991 | Kimura | 257/243 |
| 5,067,002 A | 11/1991 | Zdebel et al. | |
| 5,086,010 A * | 2/1992 | Kimura | 257/215 |
| 5,122,846 A * | 6/1992 | Haken | 257/66 |
| 5,554,862 A * | 9/1996 | Omura et al. | 257/137 |
| 5,612,242 A | 3/1997 | Hsu | |
| 5,780,353 A | 7/1998 | Omid-Zohoor | |
| 6,011,283 A * | 1/2000 | Lee et al. | 257/273 |
| 6,190,954 B1 * | 2/2001 | Lee et al. | 257/371 |
| 6,514,833 B1 | 2/2003 | Ishida et al. | |

(Continued)

FOREIGN PATENT DOCUMENTS

JP          63-304661         12/1988

OTHER PUBLICATIONS

Voldman et al., "Retention Time and Soft Error Rate Improvement by Tailoring Well Doping in Trench Dram Cells", IBM Technical Disclosure Bulletin, vol. 33, No. 1B, 1990, pp. 35-36.

(Continued)

Primary Examiner—Michael Lebentritt
Assistant Examiner—Walter L. Lindsay, Jr.
(74) Attorney, Agent, or Firm—McGinn & Gibb, PLLC; Anthony Canale

(57) ABSTRACT

A method and structure for an integrated circuit comprising a substrate of a first polarity; a trench structure in the substrate; a well region of a second polarity abutting the trench structure; and a heavily doped region of the second polarity abutting the trench structure, wherein the heavily doped region is adapted to suppress latch-up in the integrated circuit, wherein the heavily doped region comprises a sub-collector region, and wherein the trench structure comprises a deep trench structure or a trench isolation structure. The integrated circuit further comprises a p+ anode in the well region and a n+ cathode in the well region, wherein the integrated circuit is configured as a latchup robust p-n diode. In another embodiment, the integrated circuit further comprises a p+ anode in the well region; a n+ cathode in the well region; and a gate structure over the p+ anode and n+ cathode.

11 Claims, 30 Drawing Sheets

U.S. PATENT DOCUMENTS

| | | |
|---|---|---|
| 2002/0135024 A1 | 9/2002 | Logan et al. |
| 2003/0205765 A1 | 11/2003 | Masuoka |
| 6,518,628 B1 | 2/2003 | Krautschneider et al. |
| 6,525,394 B1 * | 2/2003 | Kuhn et al. ................. 257/509 |
| 6,600,199 B2 | 7/2003 | Johnson et al. |

OTHER PUBLICATIONS

L.A. Nesbit, Method of Forming Shallow Trench Isolation With Selectively Doped Sidewalls, vol. 31 No. 2, 1988, pp. 418-420.

* cited by examiner

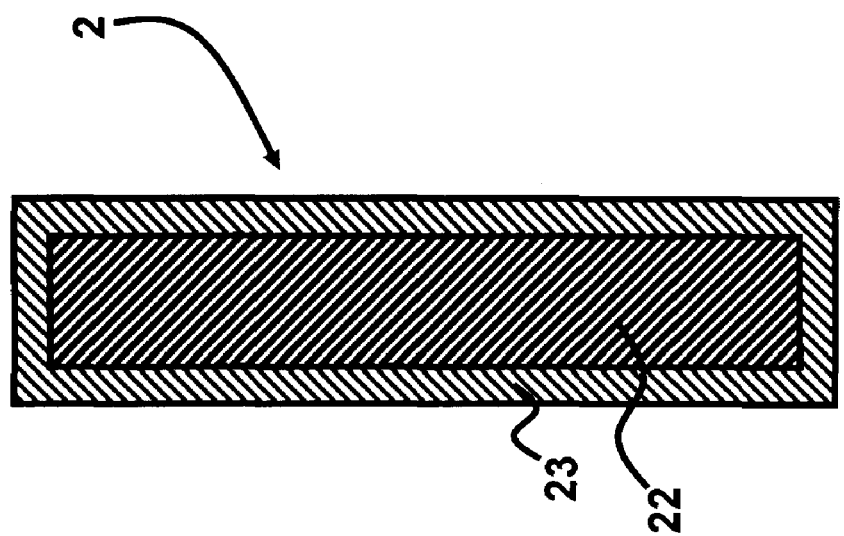

STRUCTURE AND METHOD FOR LATCHUP SUPPRESSION UTILIZING TRENCH AND MASKED SUB-COLLECTOR IMPLANTATION

BACKGROUND OF THE INVENTION

1. Field of the Invention

The embodiments of the invention generally relate to integrated circuits, and more particularly to providing latchup suppression in integrated circuits.

2. Description of the Related Art

As electronic components continue to become smaller along with the internal structures in integrated circuits, it is getting easier to either completely destroy or otherwise impair the electronic components from latchup. Latchup occurs when a pnpn structure transitions from a low current high voltage state to a high current low voltage state through a negative resistance region (i.e., forming an S-Type I-V (current/voltage) characteristic).

Latchup is typically understood as occurring within a pnpn structure, or silicon controlled rectifier (SCR) structure. It is possible for these pnpn structures to be intentionally designed, or even unintentionally formed between structures. Hence, latchup conditions can occur within peripheral circuits or internal circuits, within one circuit (intra-circuit) or between multiple circuits (inter-circuit).

Latchup is typically initiated by an equivalent circuit of a cross-coupled pnp and npn transistor. With the base and collector regions being cross-coupled, current flows from one device leading to the initiation of the second device ("regenerative feedback"). These pnp and npn elements can be any diffusions or implanted regions of other circuit elements (e.g., P-channel MOSFETs (metal oxide semiconductor field effect transistors), n-channel MOSFETs, resistors, etc.) or actual pnp and npn bipolar transistors. In complimentary metal oxide semiconductor (CMOS) structures, the pnpn structure can be formed with a p-diffusion in a n-well, and a n-diffusion in a p-substrate ("parasitic pnpn"). In this case, the well and substrate regions are inherently involved in the latchup current exchange between regions in the device.

The condition for triggering a latchup is a function of the current gain of the pnp and npn transistors, and the resistance between the emitter and the base regions. This inherently involves the well and substrate regions. The likelihood or sensitivity of a particular pnpn structure to latchup is a function of spacing (e.g., base width of the npn and base width of the pnp), current gain of the transistors, substrate resistance and spacings, the well resistance and spacings, and isolation regions.

In internal circuits and peripheral circuitry, latchup in both is a concern. Latchup can also occur as a result of the interaction of an electrostatic discharge (ESD) device, the input/output (I/O) off-chip driver, and adjacent circuitry initiated in the substrate from the overshoot and undershoot phenomena. These factors can be generated by CMOS off-chip driver circuitry, receiver networks, and ESD devices. In CMOS I/O circuitry, undershoot and overshoot can lead to injection in the substrate. Hence, both a p-channel MOSFET and a n-channel MOSFET can lead to substrate injection. Simultaneous switching of circuitry where overshoot or undershoot injection occurs, leads to injection into the substrate which leads to both noise injection and latchup conditions. Supporting elements in these circuits, such as pass transistors, resistor elements, test functions, over voltage dielectric limiting circuitry, bleed resistors, keeper networks and other elements can be present leading to injection into the substrate. Moreover, ESD elements connected to the input pad can also lead to latchup. ESD elements that can lead to noise injection and latchup include MOSFETs, pnpn SCR ESD structures, p+/n-well diodes, n-well-to-substrate diodes, n+ diffusion diodes, and other ESD circuits. ESD circuits can also contribute to noise injection into the substrate and latchup.

In particular, an additional process can occur by the interaction of "activated" and "unactivated" elements in a gate-array environment. In an application specific integrated circuit (ASIC) environment, a "sea of gates" philosophy allows customization and personalization of circuit elements at a metallization level where the silicon shapes are pre-defined. Unused n-diffusion shapes are grounded, and unused p-diffusion shapes are connected to $V_{DD}$. Unfortunately, this implementation can lead to latchup. As the substrate potential rises relative to the n-diffusion, all of the gate array elements forward bias. As the substrate potential lowers, the vertical pnp can be activated by the unused p-diffusion elements, the n-well, and the substrate. This can occur as a result of minority carrier injection in the wells and substrate regions.

In an ASIC gate array environment, it has been observed that as a negative pulse is injected into an input pad, ESD current discharge to the substrate flows outside of the I/O cell region, leading to "turn-on" of the adjacent gate array regions connected to the $V_{SS}$ and $V_{DD}$ rails, which often results in an increased likelihood of latchup, and leads to the failure of the latchup specification.

With the scaling of standard CMOS technology, the spacing of the p+/n+ region decreases leading to a lower trigger condition and the onset of CMOS latchup. With the scaling of the shallow trench isolation (STI) for aspect ratio, the vulnerability of CMOS technology to latchup has increased. Furthermore, vertical scaling of the wells, and lower n-well and p-well implant doses also has increased the lateral parasitic bipolar current gains, leading to lower latchup robustness.

With the transition from p+ substrates to low doped p– substrates, the latchup robustness has continued to decrease. With mixed signal applications and radio frequency (RF) chips, a higher concern for noise reduction has lead to the continued lowering of the substrate doping concentration. This continues to lead to lower latchup immunity in mixed signal applications and RF technologies.

FIG. 1 is a graphical illustration of I-V characteristics of a pnpn structure highlighting the points of transition. Latchup can occur from voltage or current pulses that occur on the power supply lines, such as $V_{DD}$ and $V_{SS}$. Transient pulses on power rails (e.g., substrate or wells) can trigger latchup processes. Latchup can also occur from a stimulus to the well or substrate external to the region of a SCR (i.e., a thyristor) structure from minority carriers.

Latchup can be initiated from internal or external stimulus, and is known to occur from single event upsets (SEU), which can include terrestrial emissions from nuclear processes, and cosmic ray events, as well as events in space environments. Cosmic ray particles can include proton, and neutron, gamma events, as well as a number of particles that enter the earth atmosphere. Terrestrial emissions from radioactive events, such as alpha particles, and other radioactive decay emissions can also lead to latchup in semiconductors.

For military, surveillance, satellite, and other outer space applications, it is desirable to have a high tolerance to latchup. Latchup can lead to failure of space applications triggered by cosmic rays, heavy ions, and proton and neutron events. The higher the latchup margin in military and outer space applications, the higher the vulnerability to single even upset (SEU) initiated latchup. Therefore, due to the problems associated with latchup, it would be advantageous to have structures and methods that improve the latchup tolerance in base CMOS technology or mixed signal applications.

SUMMARY OF THE INVENTION

In view of the foregoing, an embodiment of the invention provides an integrated circuit comprising a substrate of a first polarity; a trench structure in the substrate; a well region of a second polarity abutting the trench structure; and a heavily doped region of the second polarity abutting the trench structure, wherein the heavily doped region has a dopant concentration greater than a dopant concentration of the well region, wherein the heavily doped region is adapted to suppress latch-up in the integrated circuit, and wherein the heavily doped region comprises a sub-collector region. The integrated circuit further comprises a p+ anode in the well region; a n+ cathode in the well region; and a gate structure over the p+ anode and the n+ cathode. In one embodiment, the integrated circuit further comprises a shallow trench isolation region, wherein the trench structure comprises a deep trench structure having a depth and a width, wherein the depth is at least twice as large as the width, wherein the shallow trench isolation region is over the deep trench structure, and wherein an aspect ratio of the depth to the width is at least 2.85. In another embodiment, the integrated circuit further comprises a shallow trench isolation region, wherein the trench structure comprises a trench isolation region having a depth and a width, wherein the depth is at least twice as large as the width, wherein the trench isolation region traverses the shallow trench isolation region, and wherein an aspect ratio of the depth to the width is at least 2.5.

Another aspect of the invention provides a complementary metal oxide semiconductor (CMOS) device, wherein the CMOS device comprises a p-type substrate; shallow trench isolation regions in the p-type substrate; p-type diffusion regions in the p-type substrate and in between successive ones of the STI regions; a n-type retrograde well in the p-type substrate; a deep trench isolation region bounding the p-type diffusion regions and the n-type retrograde well; and a n-type sub-collector adjacent to a sidewall of the deep trench isolation region and below the STI regions, wherein the p-type diffusion regions, the n-type retrograde well, and the p-type substrate form a pnp parasitic bipolar transistor in the CMOS device, and wherein the deep trench isolation region and the n-type sub-collector are adapted to suppress latch-up in the CMOS device that is caused by the pnp parasitic bipolar transistor. In one embodiment, the n-type sub-collector comprises a uniform dopant layer. In another embodiment, the n-type sub-collector comprises a discontinuous dopant layer. Additionally, the n-type sub-collector is adjacent to a lower surface of the n-type retrograde well. Furthermore, the deep trench isolation region comprises a depth and a width, wherein the depth is at least twice as large as the width, and wherein the shallow trench isolation regions are over the deep trench isolation region.

Another embodiment of the invention provides a method of forming an integrated circuit, wherein the method comprises forming a substrate of a first polarity; forming a trench structure in the substrate; forming a well region of a second polarity abutting the trench structure; and configuring a heavily doped region of the second polarity abutting the trench structure, wherein the heavily doped region having a dopant concentration greater than a dopant concentration of the well region, wherein the heavily doped region suppresses latch-up in the integrated circuit, and wherein in the configuring of the heavily doped region of the second polarity, the heavily doped region comprises a sub-collector region. The method further comprises forming a p+ anode in the well region; forming a n+ cathode in the well region; and forming a gate structure over the p+ anode and the n+ cathode. In one embodiment, the method further comprises configuring a shallow trench isolation region in the substrate, wherein the trench structure is configured as a deep trench structure having a depth and a width, wherein the depth is at least twice as large as the width, wherein the shallow trench isolation region is configured over the deep trench structure, and wherein an aspect ratio of the depth to the width is at least 2.85.

Another embodiment of the invention provides a method of forming an integrated circuit, wherein the method comprises forming a substrate of a first polarity; forming a well region of a second polarity in the substrate; configuring a heavily doped region of the second polarity in the substrate, wherein the heavily doped region comprises a dopant concentration greater than a dopant concentration of the well region; and forming a trench structure in the substrate and through the well region and the heavily doped region, wherein the trench structure and heavily doped region suppresses latch-up in the integrated circuit. The method further comprises forming a p+ anode in the well region; forming a n+ cathode in the well region; and forming a gate structure over the p+ anode and the n+ cathode. In the process of configuring the heavily doped region of the second polarity, the heavily doped region comprises a sub-collector region. The method further comprises configuring a shallow trench isolation region in the substrate, wherein the trench structure is configured as a trench isolation region having a depth and a width, wherein the depth is at least twice as large as the width, wherein the trench isolation region traverses the shallow trench isolation region, and wherein an aspect ratio of the depth to the width is at least 2.5.

The embodiments of the invention improve the latchup robustness in CMOS devices. A trench isolation region or deep trench structure and a highly doped region, such as a n-type sub-collector, are formed in proximity to a CMOS device. A portion of the trench sidewall on the device side of the trench is in contact with the high dopant region. The high dopant region is formed below the CMOS device area and can be configured as a continuous or masked dopant region. The trench and high dopant region prevent carriers from going under the trench, thus $V_{turnon}$ is increased and the CMOS device's latchup robustness is improved.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 31 is an isolated cross-sectional view of a deep trench isolation region according to an embodiment of the invention.

DETAILED DESCRIPTION OF PREFERRED

Embodiments of the Invention

Figure 1:
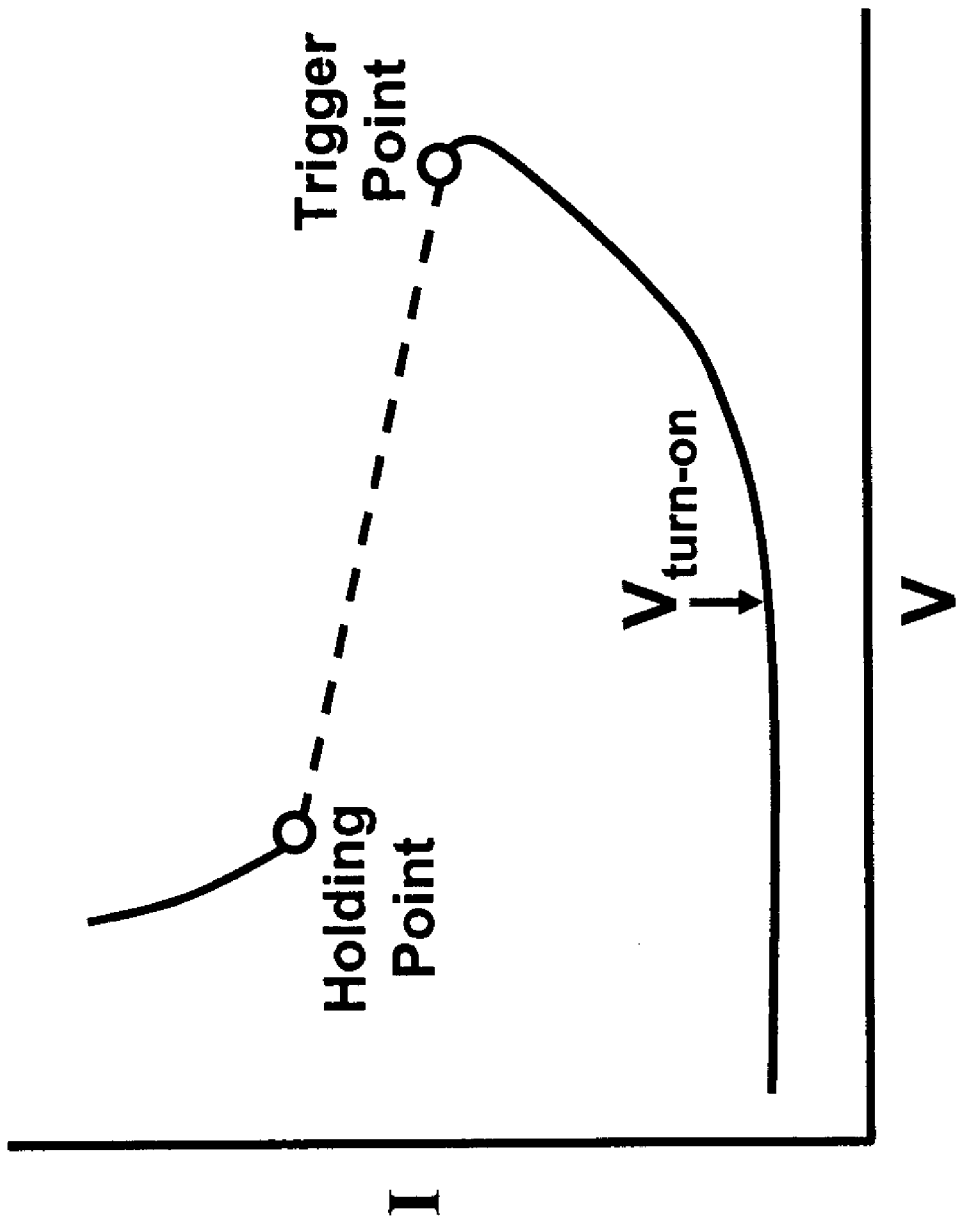
FIG. 1 is a graphical illustration of conventional I-V characteristics of a pnpn structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a structure and method that improves the latchup tolerance in base CMOS technology or mixed signal applications. The embodiments of the invention address this need by providing a structure and method for providing improved latchup robustness in CMOS, RF CMOS, and RF BiCMOS Silicon Germanium technology. Referring now to the drawings, and more particularly to FIGS. 2 through 31 where similar reference characters denote corresponding features consistently throughout the figures, there are shown preferred embodiments of the invention.

Latchup can be quantified based on a "trigger" and "holding" condition as illustrated in FIG. 1. A "turn-on" state occurs prior to the trigger condition. This "turn-on" state is related to a sidewall trench mechanism leading to a modulation of the latchup condition. Generally, the embodiments of the invention utilize a CMOS structure comprising a p+ diffusion in a n-well region. This n-well is formed in a substrate region. The pnpn structure also includes a n+ region, which forms the pnpn structure. Moreover, the embodiments of the invention incorporate a deep trench (DT) structure within the pnpn structure for improvement of the latchup robustness of the underlining CMOS technology and BiCMOS SiGe and BiCMOS SiGeC technology. Furthermore, the DT structure provided by the embodiments of the invention may also be incorporated into partially depleted silicon insulator technology or other known semiconductor processes.

Figure 2:
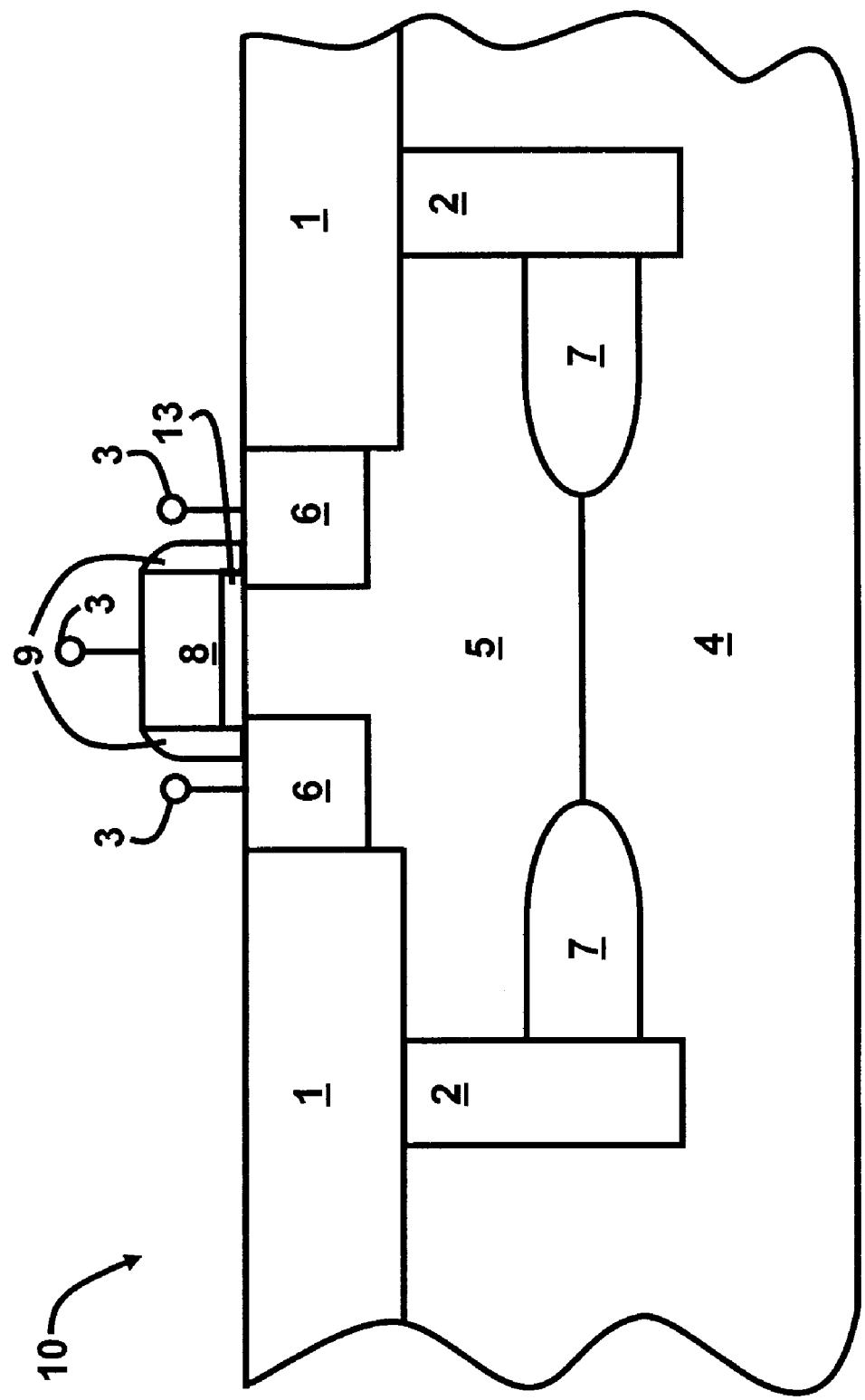
FIGS. 2 through 5 are schematic diagrams of a latchup robust p-channel MOSFET structure according to an embodiment of the invention.
Figure 3:
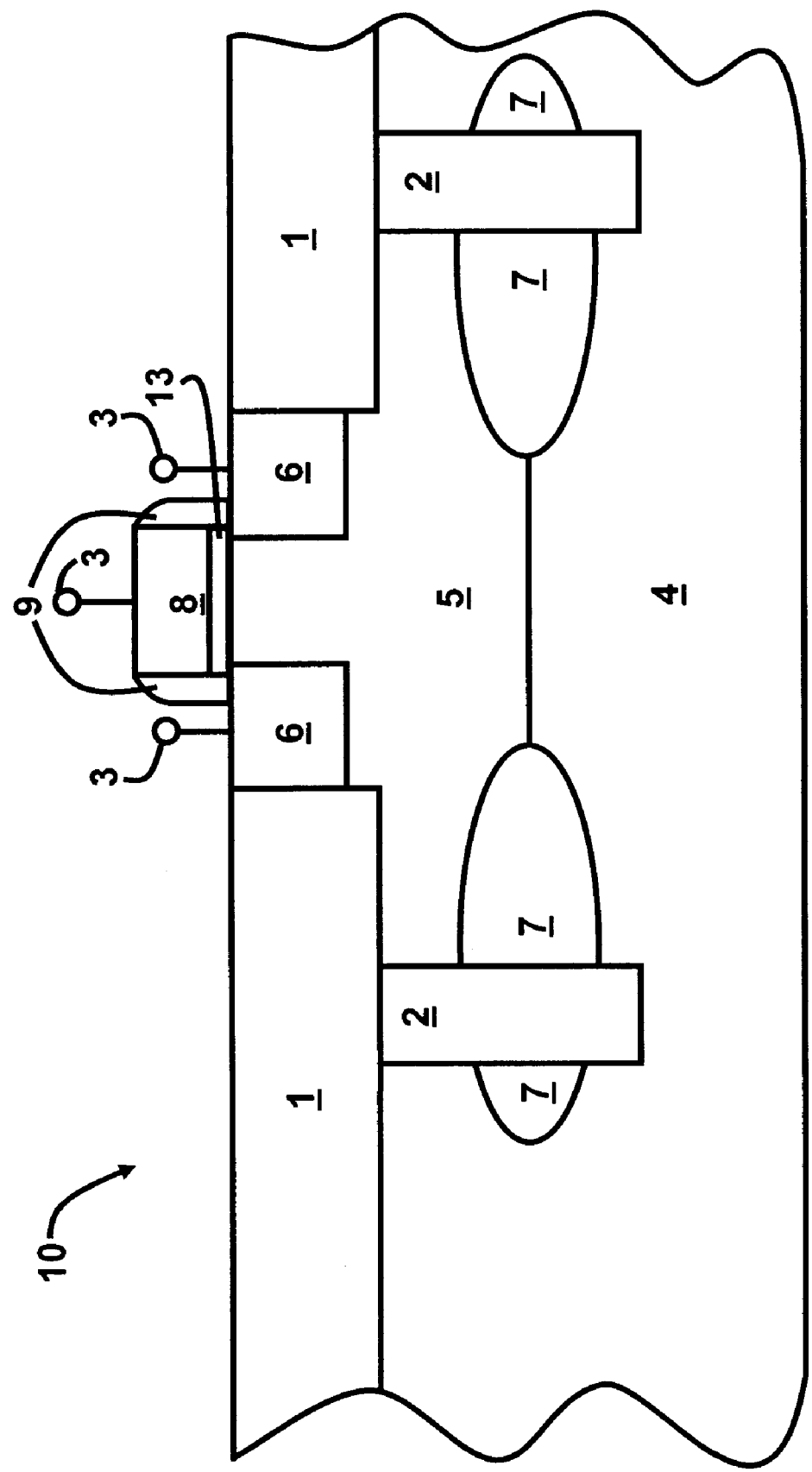
Figure 30:
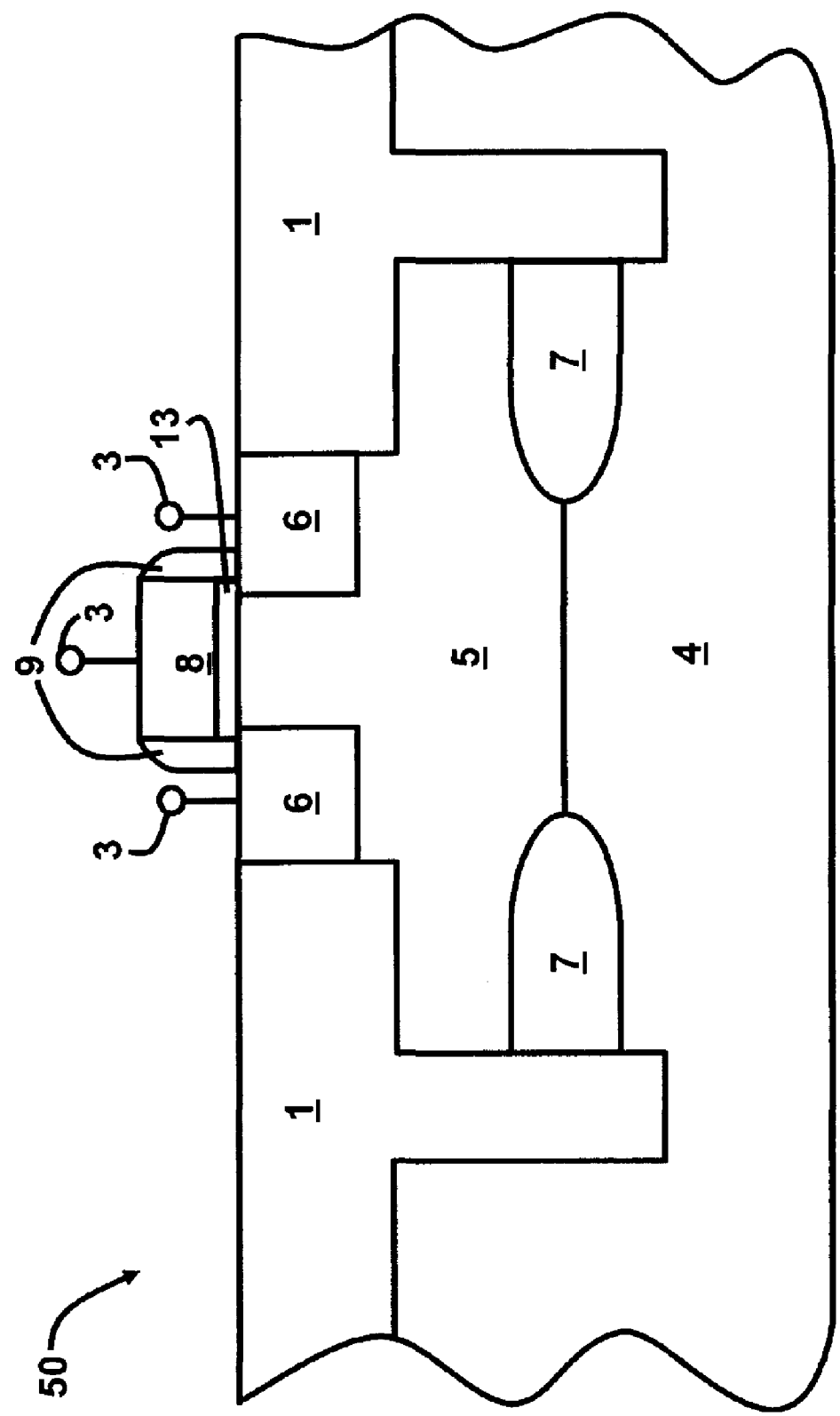
FIG. 30 is a schematic diagram of an integrated circuit having a dual depth shallow trench isolation structure according to an embodiment of the invention.

FIGS. 2 and 3 illustrate a latchup robust p-channel MOSFET 10 according to an embodiment of the invention. The performance of the p-channel MOSFET 10 is improved by the addition of a n-type sub-collector implant 7 and DT structure 2. Accordingly, the latchup robust p-channel MOSFET 10 comprises a substrate 4 comprising a STI region 1, a DT isolation region 2, and a retrograde well region 5 formed therein. The STI region 1 is used to define the openings for MOSFETs, bipolar transistors, and other semiconductor components. Moreover, the STI region 1 varies from 0.1 to 0.5 µm in depth and is formed prior completion of the MOSFET and bipolar transistors. The DT structure 2 is formed early in the semiconductor process after epitaxial growth in a BiCMOS process. As further illustrated in FIG. 31, the DT structure 2 comprises an oxide sidewall 23 and is filled with a polysilicon material 22. As such, the DT structure 2 is filled with the polysilicon material 22 to avoid thermal stress. The depth of the DT structure 2 can range from 4 µm to 12 µm. A masked sub-collector region 7 is formed in the substrate 4, just below the well region 5. Configured adjacent to the STI region 1 is a p-channel source/drain region 6 with a gate region 8 configured above a gate dielectric layer 13, which is above and between the source/drain regions 6. Moreover, a pair of insulative sidewall spacers 9 is formed surrounding the gate 8. Additionally, contacts 3 and metallurgy are formed on the p-channel source/drain 6 and gate 8 regions, respectively. In the preferred embodiment, the sub-collector region 7 can exist on the inside sidewall of the DT structure 2 (additionally shown in FIGS. 15 through 21), or the sub-collector region 7 may be present on the inside and outside edge of the DT structure 2. Additionally, the DT structure 2 can be configured to extend to the top surface of the sub-collector 7, penetrate the top surface of the sub-collector 7, or penetrate the bottom surface of the sub-collector 7. Furthermore, the sub-collector 7 may comprise an epitaxial formation thereon, or in the case of an implanted sub-collector 7, there is no epitaxial formation after the formation of the sub-collector 7. In an alternative embodiment, as illustrated in FIG. 30, the STI region 1 may be configured as a dual depth STI region 1 and may extend to the top surface of the sub-collector 7, or penetrate the bottom surface of the sub-collector 7.

Figure 4:
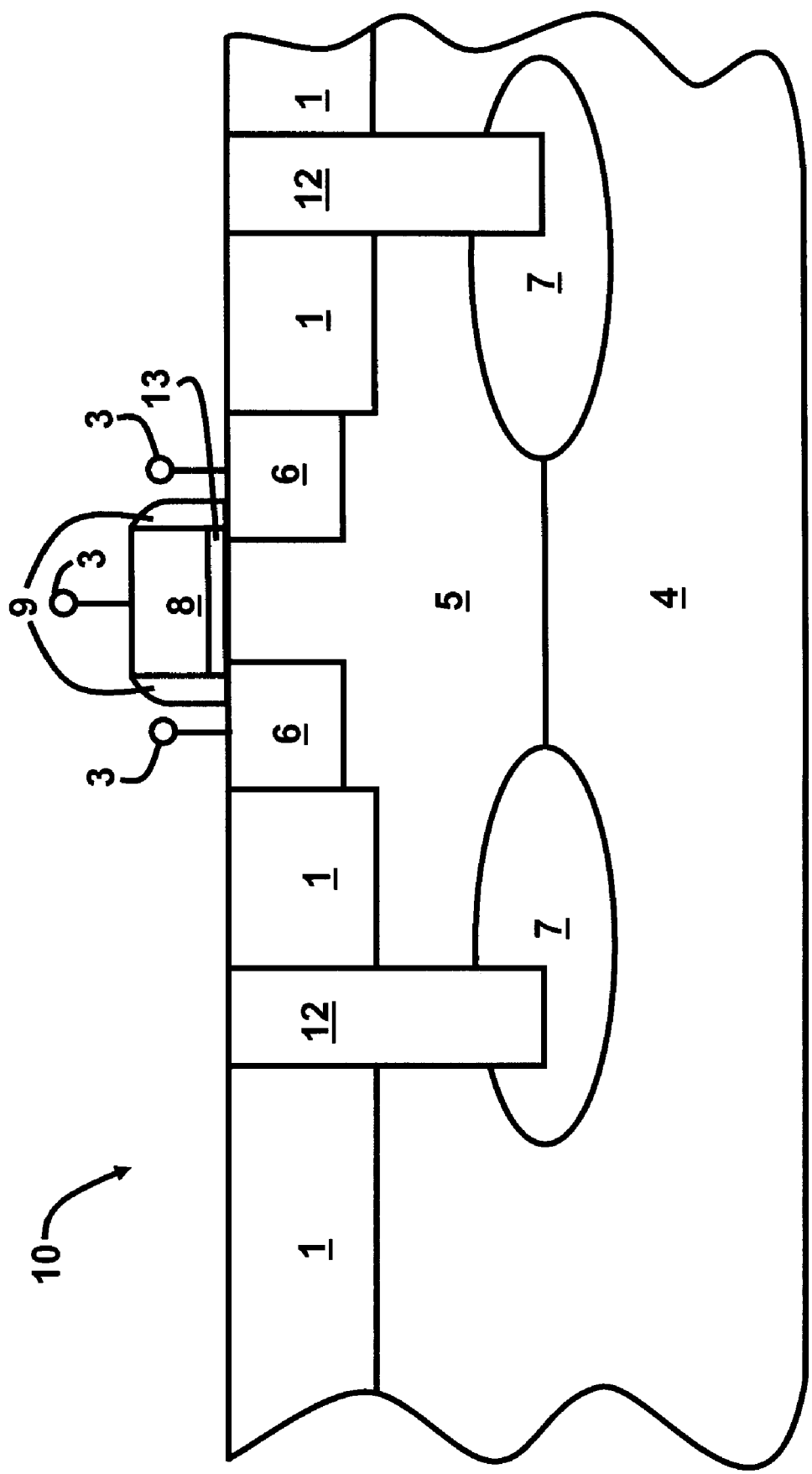
Figure 5:
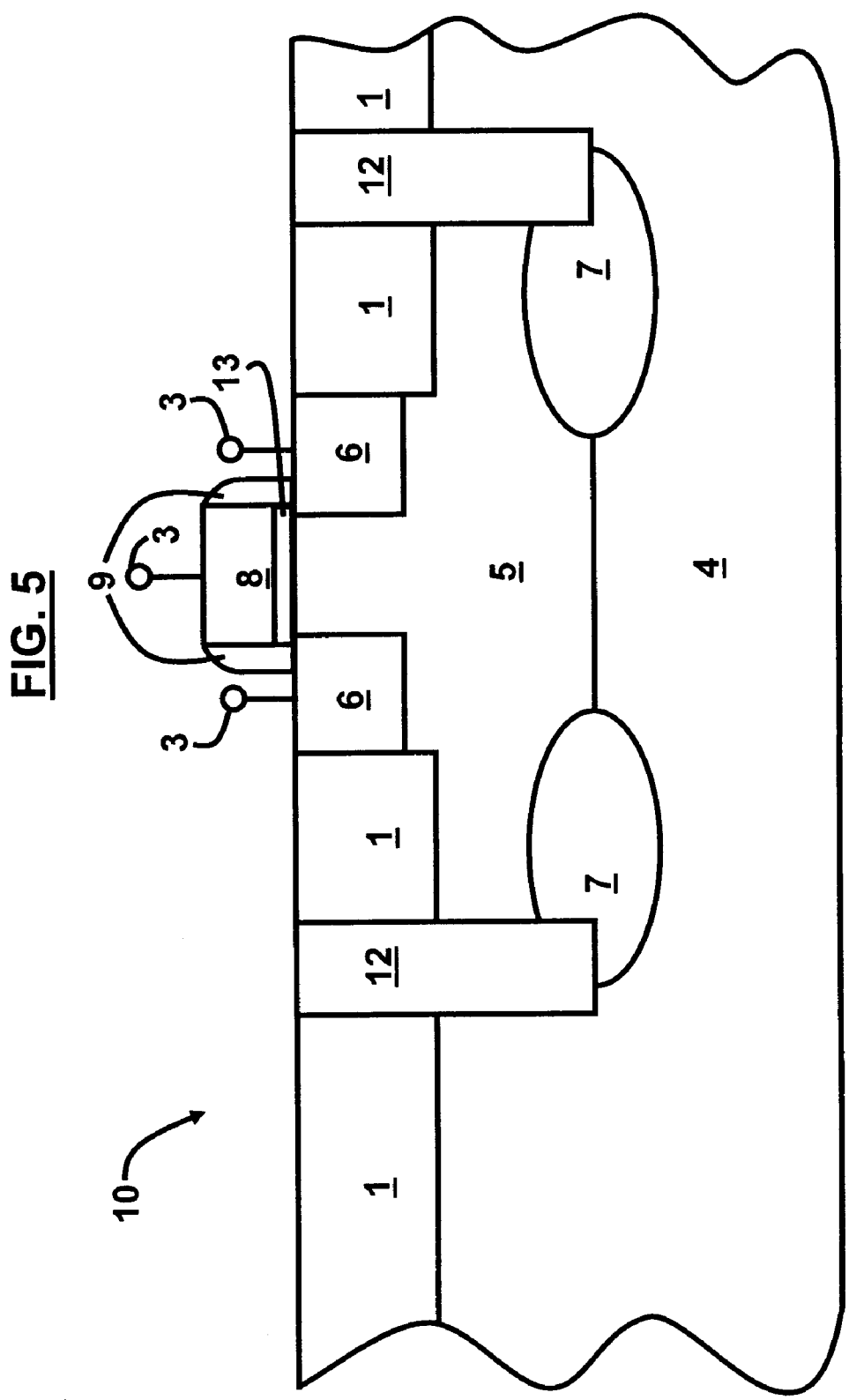
Figure 6:
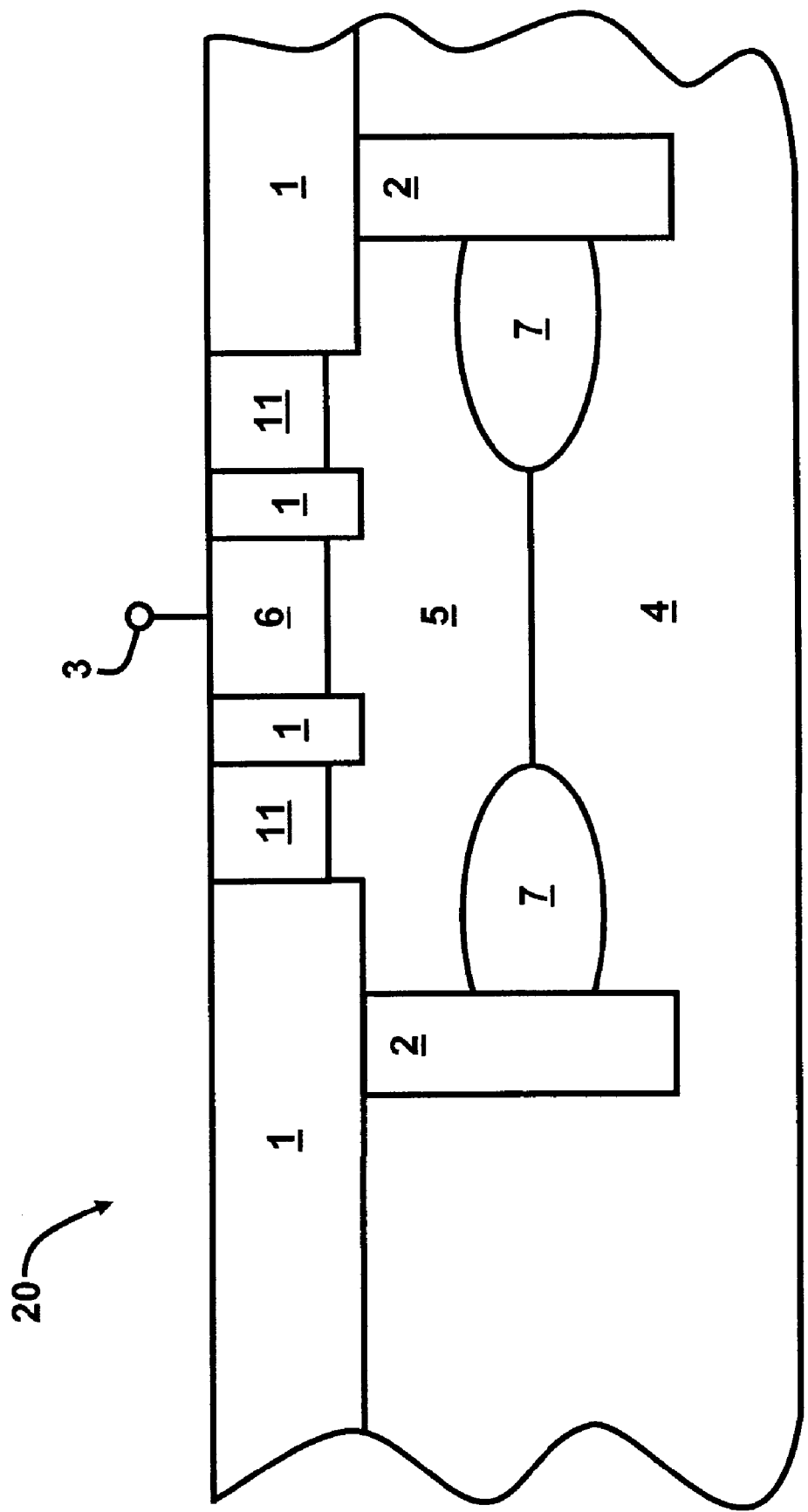
FIGS. 6 through 10 are schematic diagrams of a latchup robust p-n diode structure according to an embodiment of the invention.
Figure 7:
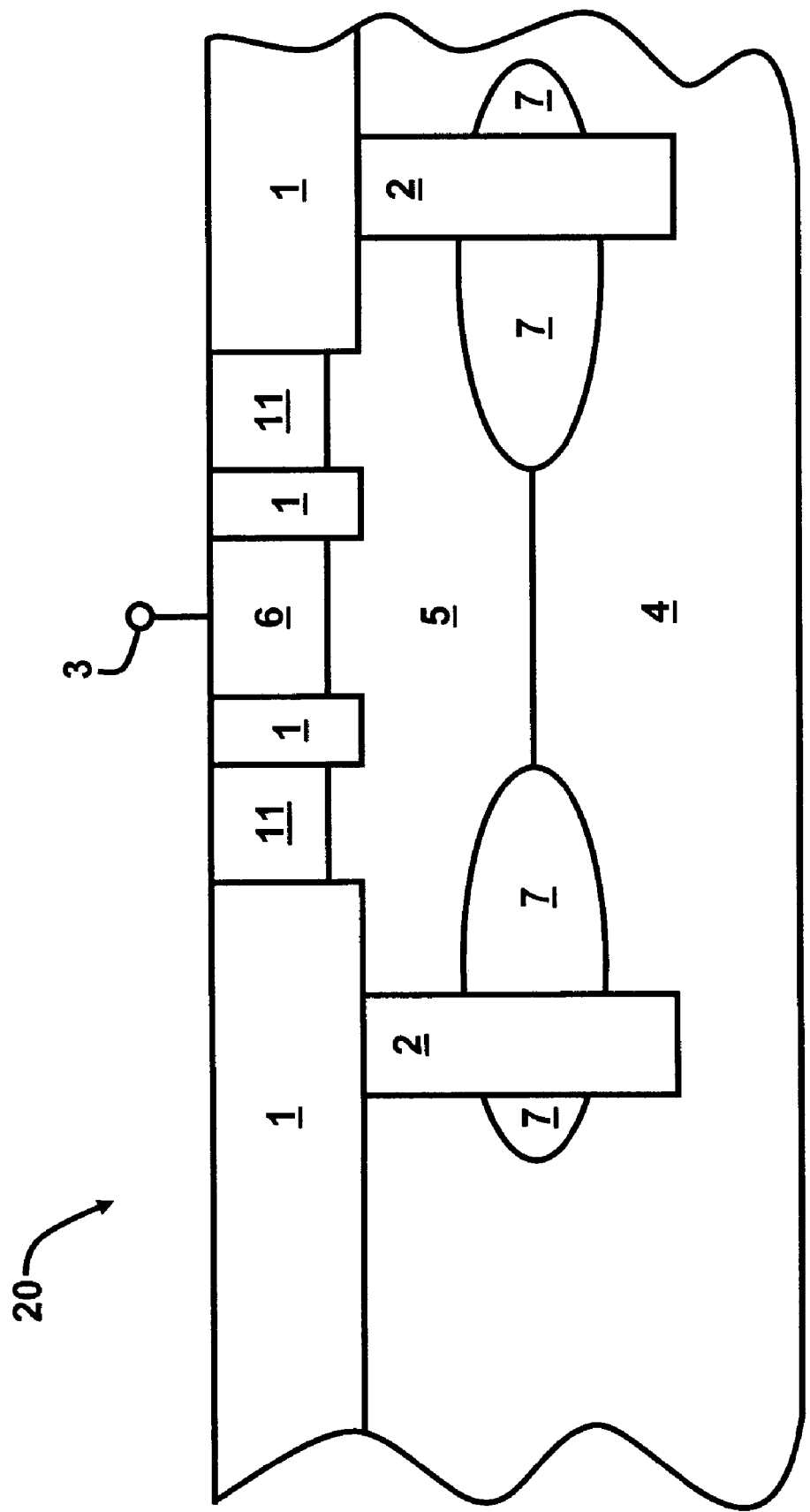

In the case of the trench isolation (TI), as illustrated in FIGS. 4 and 5, the formation of the insulator region can be completed after formation of the device in the silicon surface. In FIG. 3, the DT isolation structure 2 penetrates through the deepest doped region 7. In FIG. 4, the TI structure 12 is formed after the STI region 1, and hence penetrates through the physical structure, which is contrary to the formation of the DT structure 2 of FIG. 3, wherein the DT structure 2 is formed prior to the formation of the STI region 1. The TI structure 12 is less costly to fabricate and is implemented late in the semiconductor process. As a result, the TI structure 12 can be formed using a contact etch process after the MOSFET and bipolar transistors are formed in a BiCMOS process. In this case, the TI structure 12 can be filled with oxide insulator due to low thermal cycles after completion of this processing step. The TI structure 12 can also be referred to as a silicon dioxide filled TI structure 12, and is significantly deeper than the surface STI structures 1. The TI structure 12 is generally 2 to 4 $\mu$m deep and is formed at the back-end-of-line (BEOL) contact etch.

In FIGS. 4 and 5, the MOSFET 10 includes a substrate 4, a masked sub-collector 7 in the substrate, an epitaxial region formed on the masked sub-collector 7, a well region 5 above the sub-collector 7, a STI structure 1 formed in the well region 5, a p-channel source/drain 6 formed in the well region 5, and a gate 8 region atop a dielectric layer 13 over the well region 5. The MOSFET 10 further includes a trench isolation structure 12, contacts 3 and metallurgy on the p-channel source/drain 6 and gate 8 regions, and a pair of insulative sidewall spacers 9 surrounding the gate 8. As with the first embodiment, the sub-collector region 7 can exist on the inside sidewall of the trench structure 12, or the sub-collector region 7 may be present on the inside and outside edge of the DT structure 2. Additionally, the trench structure 12 can be configured to extend to the top surface of the sub-collector 7, penetrate the top surface of the sub-collector 7, or penetrate the bottom surface of the sub-collector 7.

FIGS. 6 through 10 illustrate a latchup robust p-n diode structure 20 according to the embodiments of the invention. The diode structures 20 provided by the embodiments of the invention are important for ESD applications. It is important that ESD elements do not initiate latchup or noise injection. Hence, latchup robust diode elements, such as those provided by the embodiments of the invention, that do not lead to noise injection are advantageous. According to this aspect of the invention, the sub-collector region 7 can exist on the inside sidewall of the trench structure 2, 12, or be present on the inside and outside edge. The trench structure 2, 12 can extend to the top surface of the sub-collector 7, penetrate the top surface of the sub-collector 7, or penetrate the bottom surface of the sub-collector 7.

Generally, the diode structure 20 comprises a substrate 4, a masked sub-collector 7 in the substrate, an epitaxial region formed on the masked sub-collector 7, which serves as the basis for the formation of a well region 5 above the sub-collector 7, a STI structure 1 formed in the well region 5, a p+ anode 6 and n+ cathode 111 formed in the well region 5. The MOSFET 10 further includes a DT structure 2 and contacts 3 and metallurgy on the p-channel anode 6. In the preferred embodiment, the sub-collector region 7 can exist on the inside sidewall of the DT structure 2 (additionally shown in FIGS. 15 through 21), or the sub-collector region 7 may be present on the inside and outside edge of the DT structure 2. Additionally, the DT structure 2 can be configured to extend to the top surface of the sub-collector 7, penetrate the top surface of the sub-collector 7, or penetrate the bottom surface of the sub-collector 7. Furthermore, the sub-collector 7 may comprise an epitaxial formation thereon, or in the case of an implanted sub-collector 7, there is no epitaxial formation after the formation of the sub-collector 7.

Figure 8:
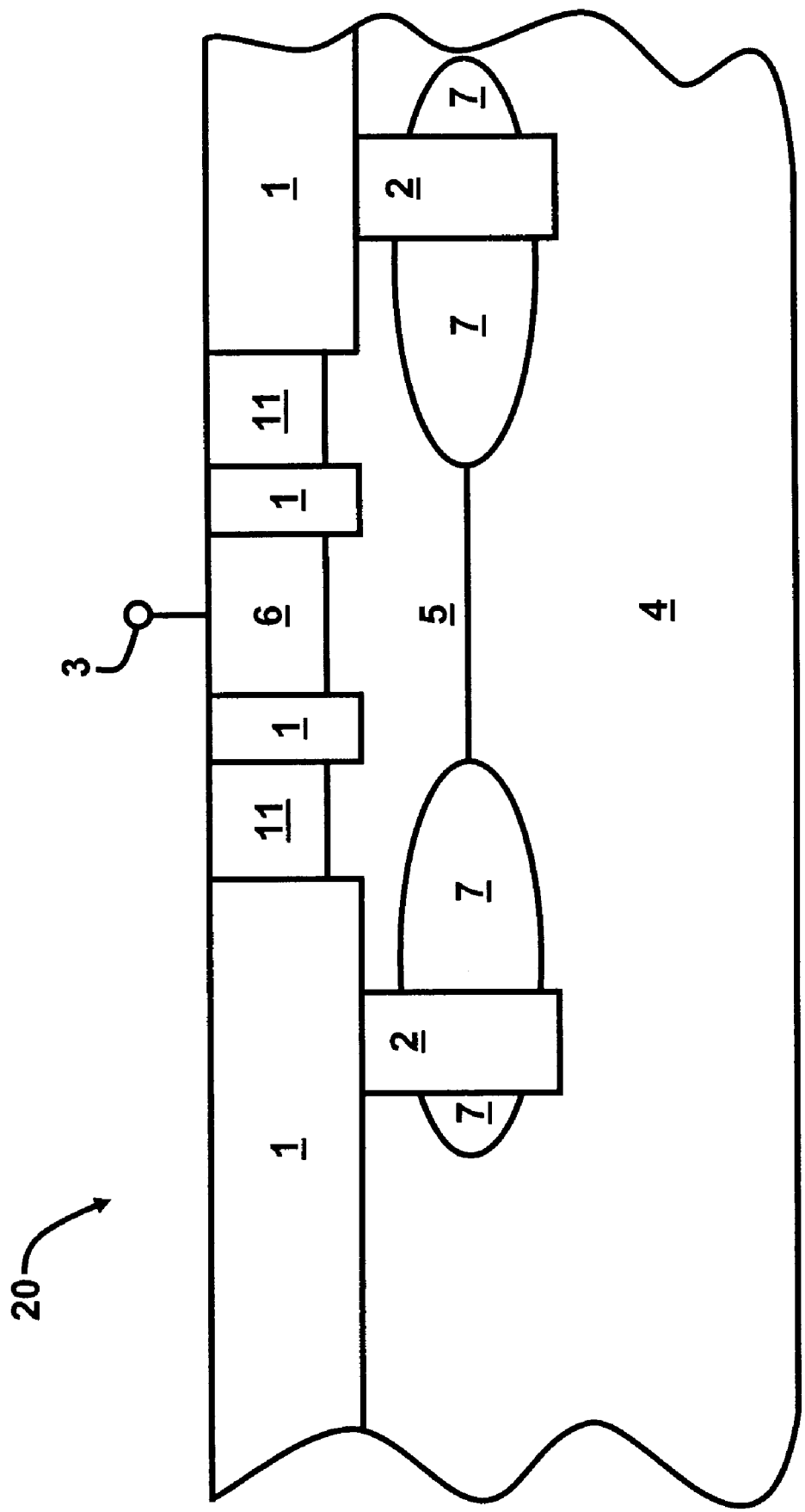
Figure 9:
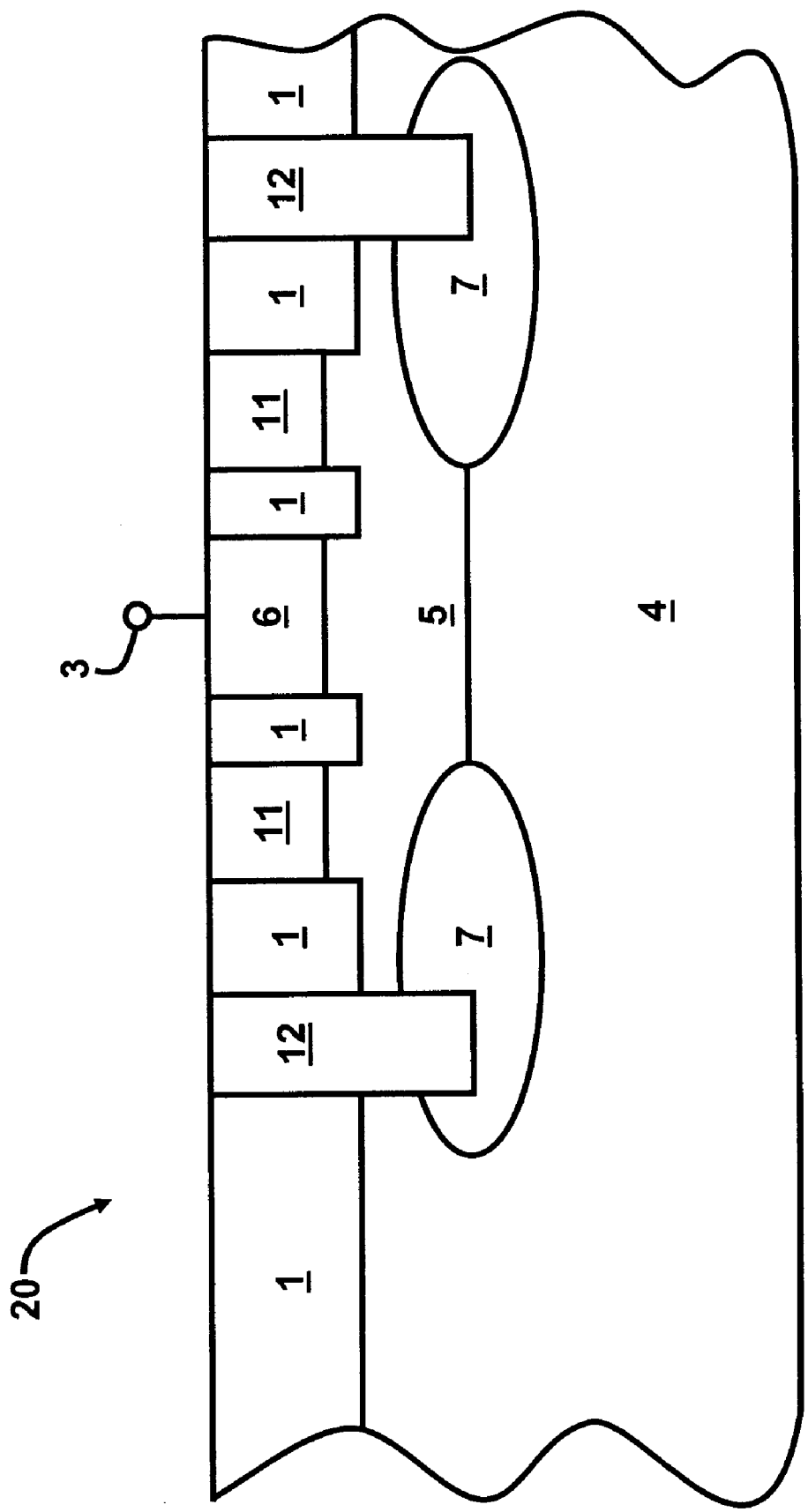
Figure 10:
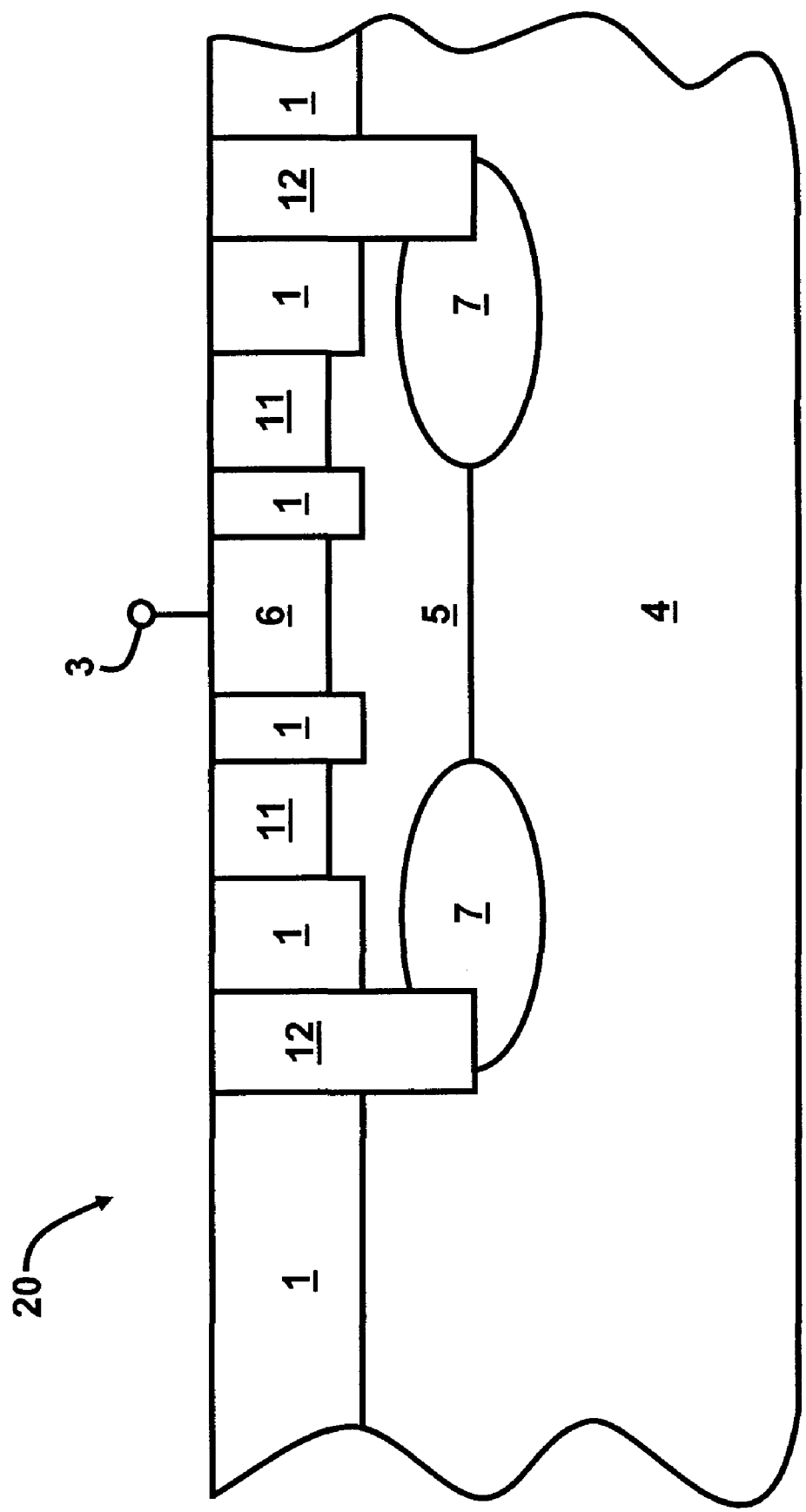

In the case of the trench isolation (TI), as illustrated in FIGS. 9 through 10, the formation of the insulator region can be completed after formation of the device in the silicon surface. In such a case, the diode 20 includes a substrate 4, a masked sub-collector 7 in the substrate, an epitaxial region formed on the masked sub-collector 7, which serves as the basis for the formation of a well region 5 above the sub-collector 7, a STI structure 1 formed in the well region 5, and a p+ anode 6 and n+ cathode formed in the well region 5. The MOSFET 10 further includes a trench structure 12, contacts 3 and metallurgy on the p-channel anode 6. As with the previous embodiment, the sub-collector region 7 can exist on the inside sidewall of the trench structure 12, or the sub-collector region 7 may be present on the inside and outside edge of the DT structure 2. Additionally, the trench structure 12 can be configured to extend to the top surface of the sub-collector 7, penetrate the top surface of the sub-collector 7, or penetrate the bottom surface of the sub-collector 7. In FIG. 8, the DT isolation structure 2 penetrates through the deepest doped region 7. In FIG. 9, the TI structure 12 is formed after the STI region 1 is formed, and hence penetrates through the physical structure, which is contrary to the formation of the DT structure 2 of FIG. 8, wherein the DT structure 2 is formed prior to the formation of the STI region 1.

Figure 11:
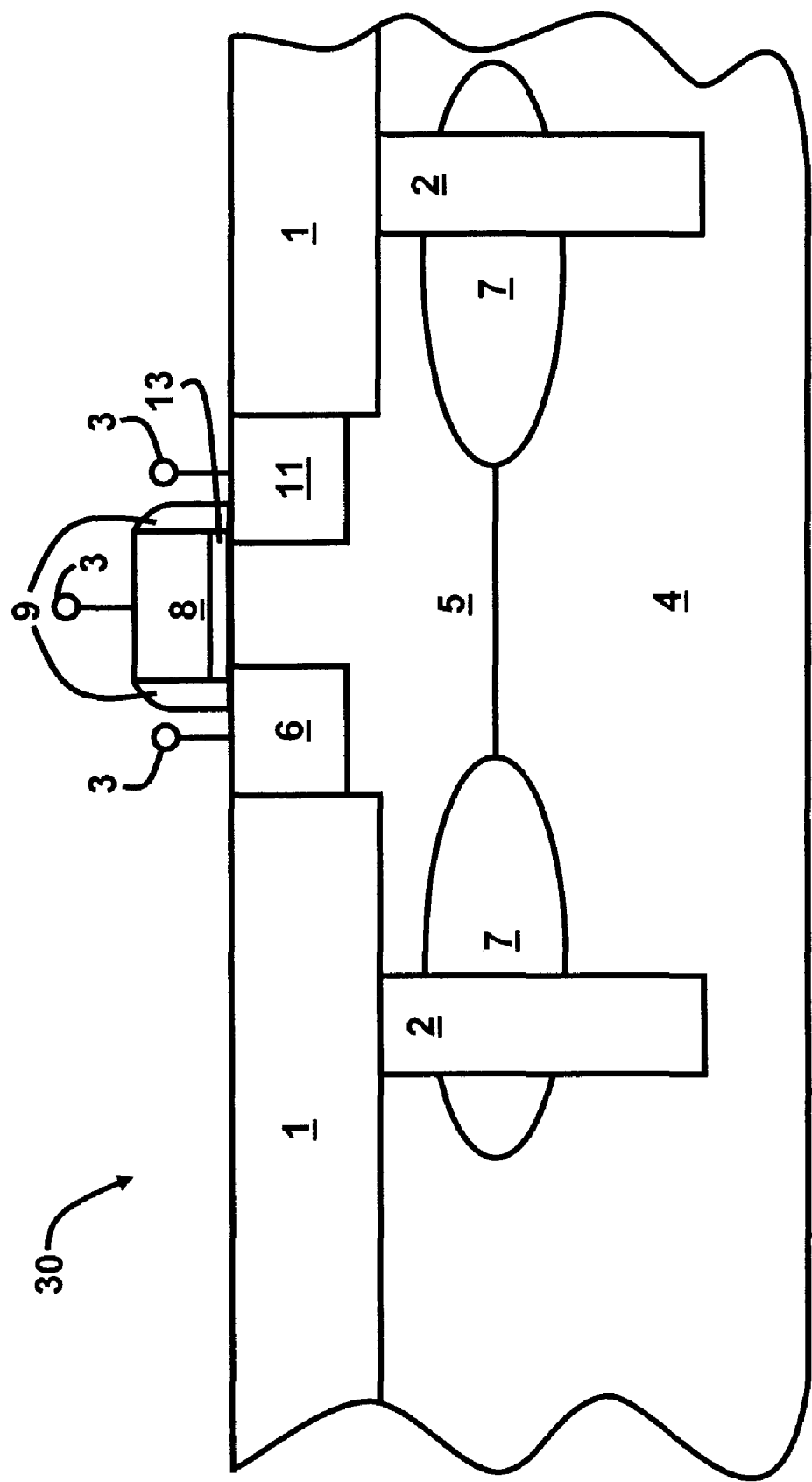
FIGS. 11 and 12 are schematic diagrams of a latchup robust polysilicon gated p-n diode structure according to an embodiment of the invention.
Figure 12:
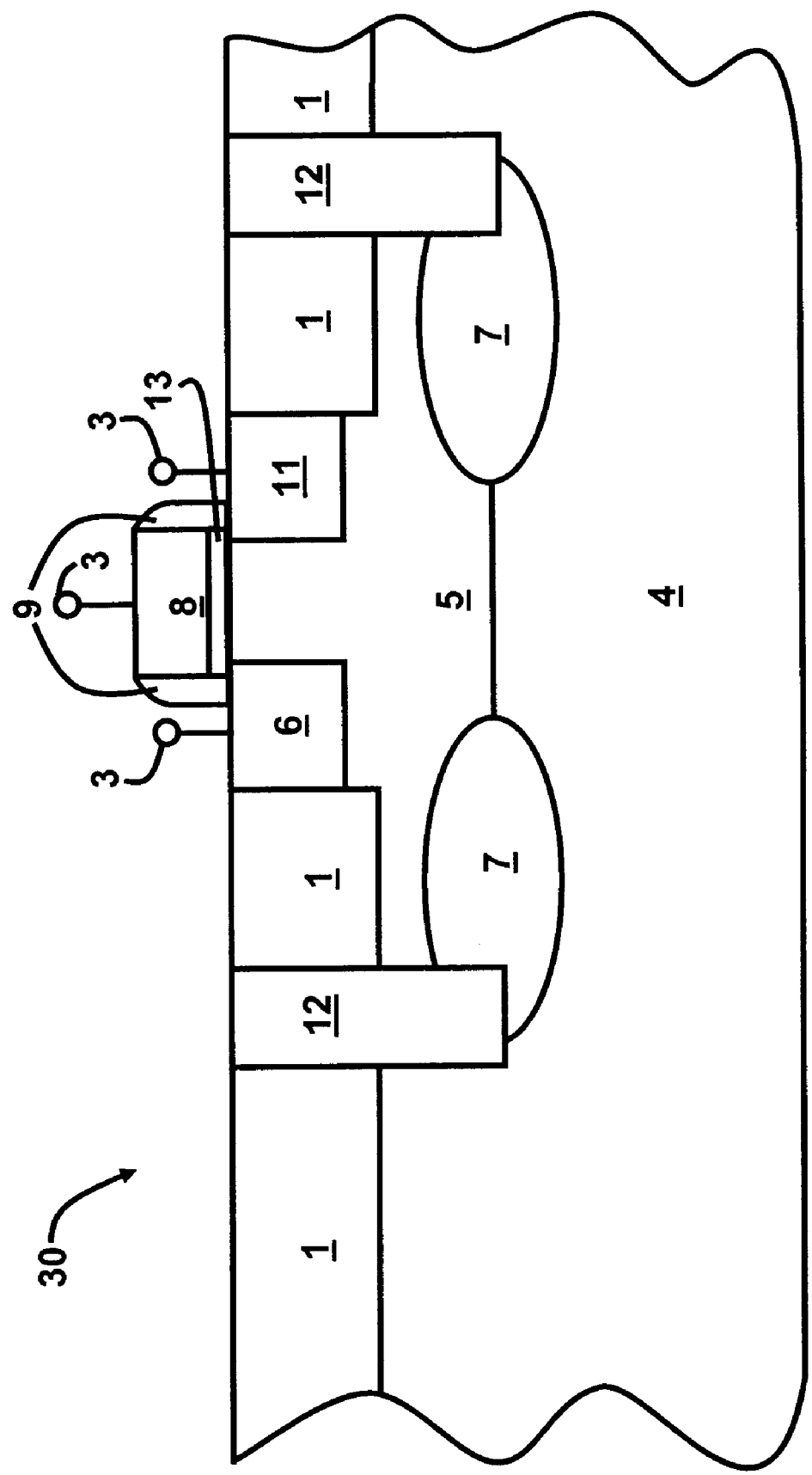

FIGS. 11 and 12 illustrate a latchup robust polysilicon gated p-n diode structure 30 according to an embodiment of the invention. As in the prior embodiments, the latchup robust polysilicon gated p-n diode structure 30 is advantageous for ESD applications. These elements are significant in the reduction of ESD induced latchup events. The polysilicon gated p-n diode structure 30 comprises a substrate 4 comprising a shallow trench isolation (STI) region 1, a deep trench (DT) isolation region 2, and a retrograde well region 5 formed therein. A masked sub-collector region 7 is formed in the substrate 4 just below the well region 5. Configured adjacent to the STI region 1 is a p+ anode 6 and a n+ cathode 11 with a gate region 8 configured above a gate dielectric layer 13, which is above and between the anode 6 and cathode 11. Moreover, a pair of insulative sidewall spacers 9 is formed surrounding the gate 8. Additionally, contacts 3 and metallurgy are formed on the anode 6, cathode 11, and gate 8 regions, respectively. In the preferred embodiment, the sub-collector region 7 can exist on the inside sidewall of the DT structure 2 (FIG. 11) (additionally shown in FIGS. 15 through 21) (isolation structure 12 in FIG. 12), or the sub-collector region 7 may be present on the inside and outside edge of the DT structure 2 (FIG. 111) (isolation structure 12 in FIG. 12). Additionally, the DT structure 2 (FIG. 11) (isolation structure 12 in FIG. 12) can be configured to extend to the top surface of the sub-collector 7, penetrate the top surface of the sub-collector 7, or penetrate the bottom surface of the sub-collector 7. Furthermore, the sub-collector 7 may comprise an epitaxial formation thereon, or in the case of an implanted sub-collector 7, there is no epitaxial formation after the formation of the sub-collector 7. In the case of the trench isolation (TI), as illustrated in FIG. 12, the formation of the insulator region can be completed after formation of the device in the silicon surface.

Figure 13:
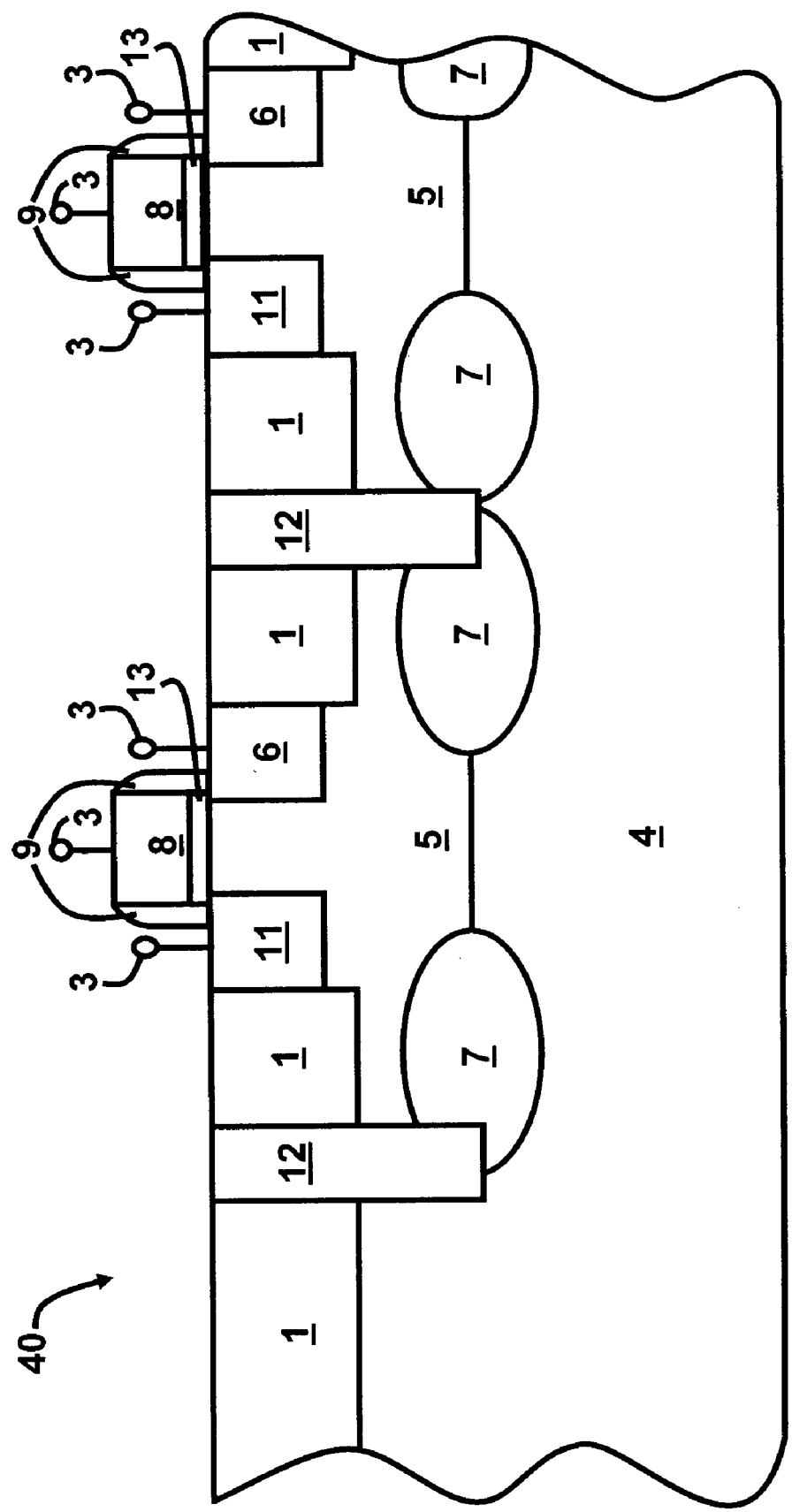
FIGS. 13 and 14 are schematic diagrams of a latchup robust silicon controlled rectifier structure according to an embodiment of the invention.
Figure 14:
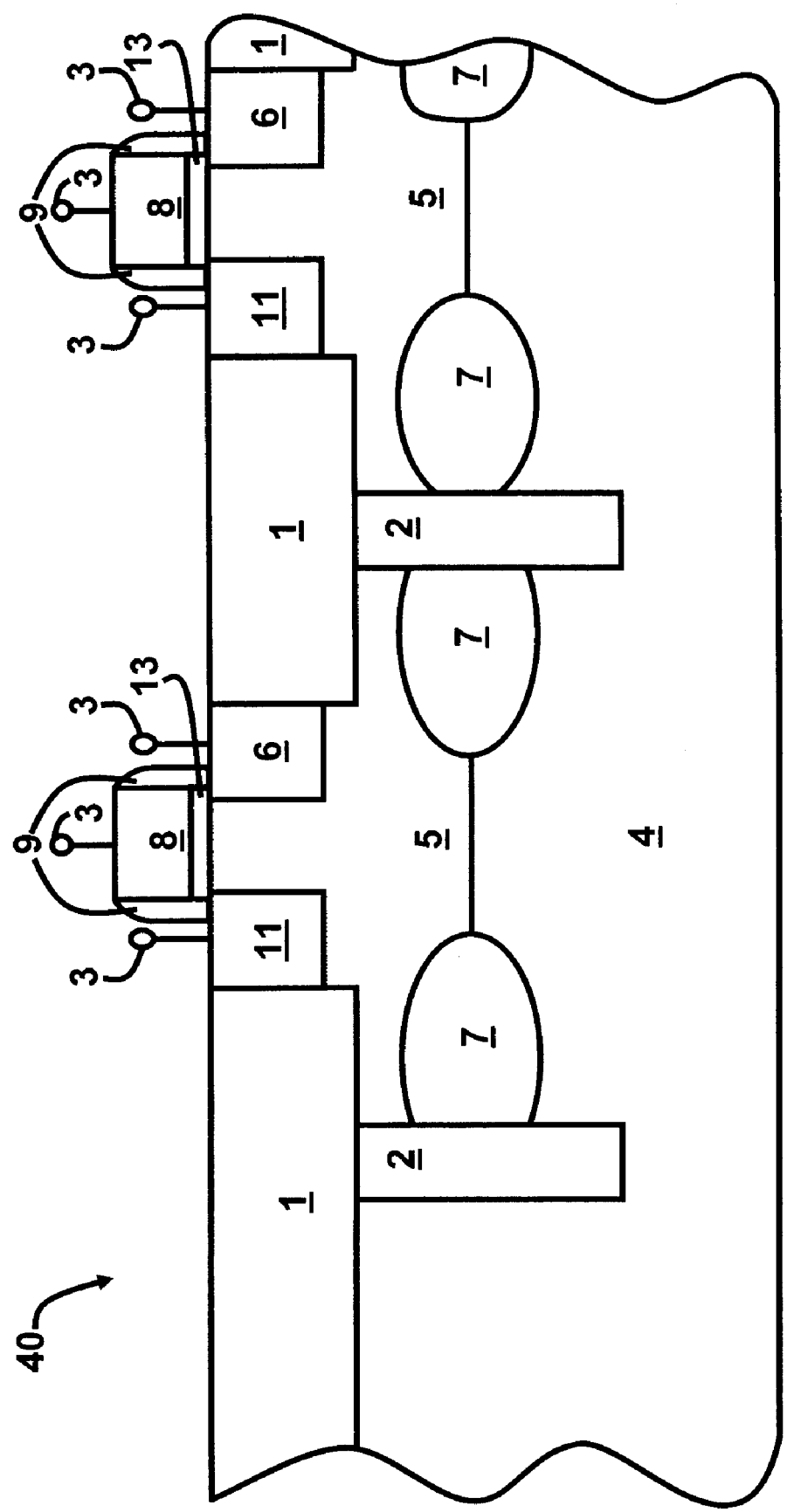
Figure 15:
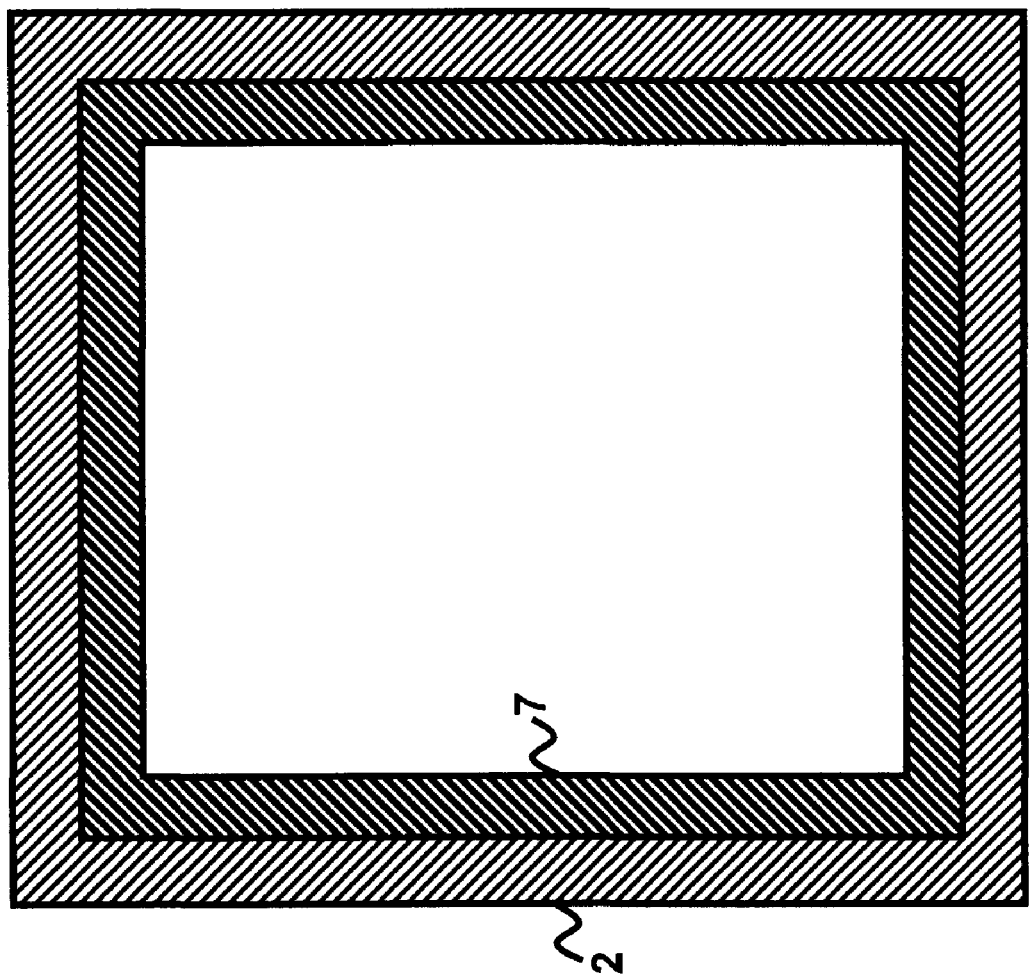
FIG. 15 is a schematic diagram of a layout of a trench and masked sub-collector without ballasting according to an embodiment of the invention.
Figure 16:
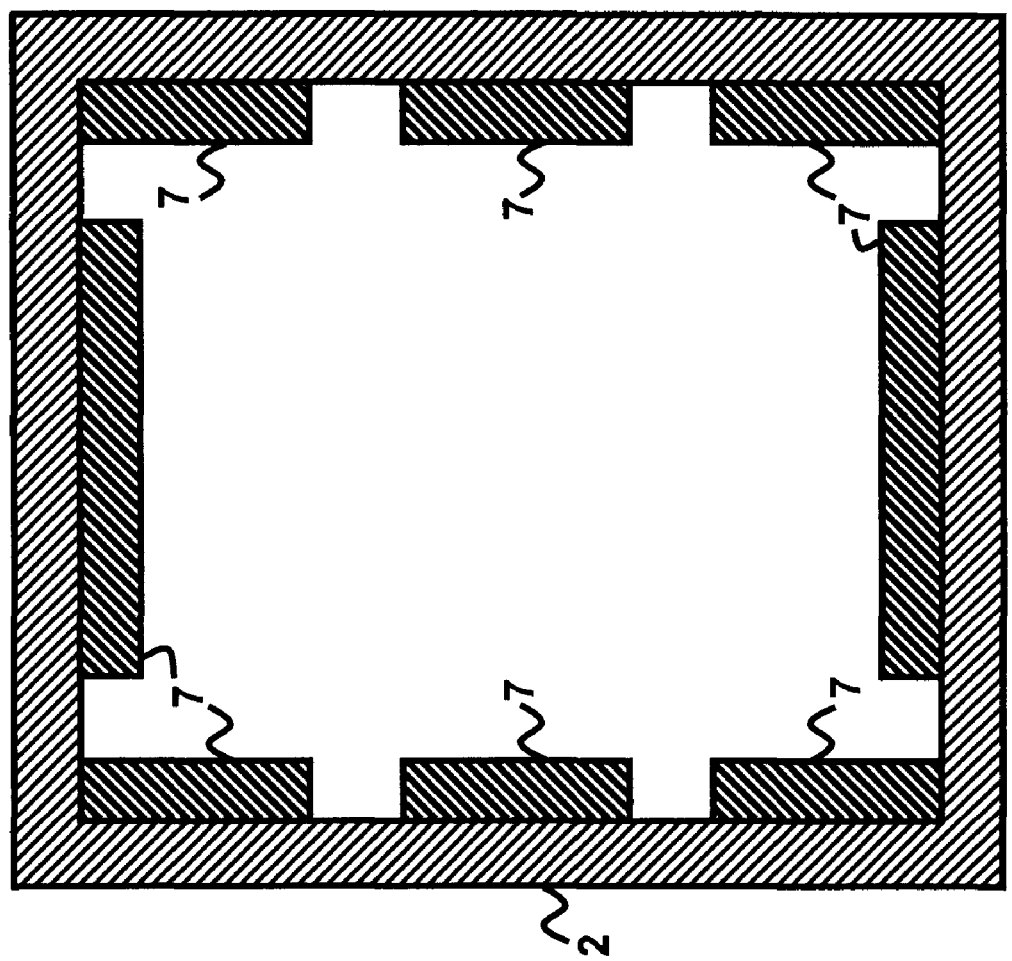
FIGS. 16 through 21 are schematic diagrams of a layout of a trench and masked sub-collector with ballasting according to an embodiment of the invention.
Figure 17:
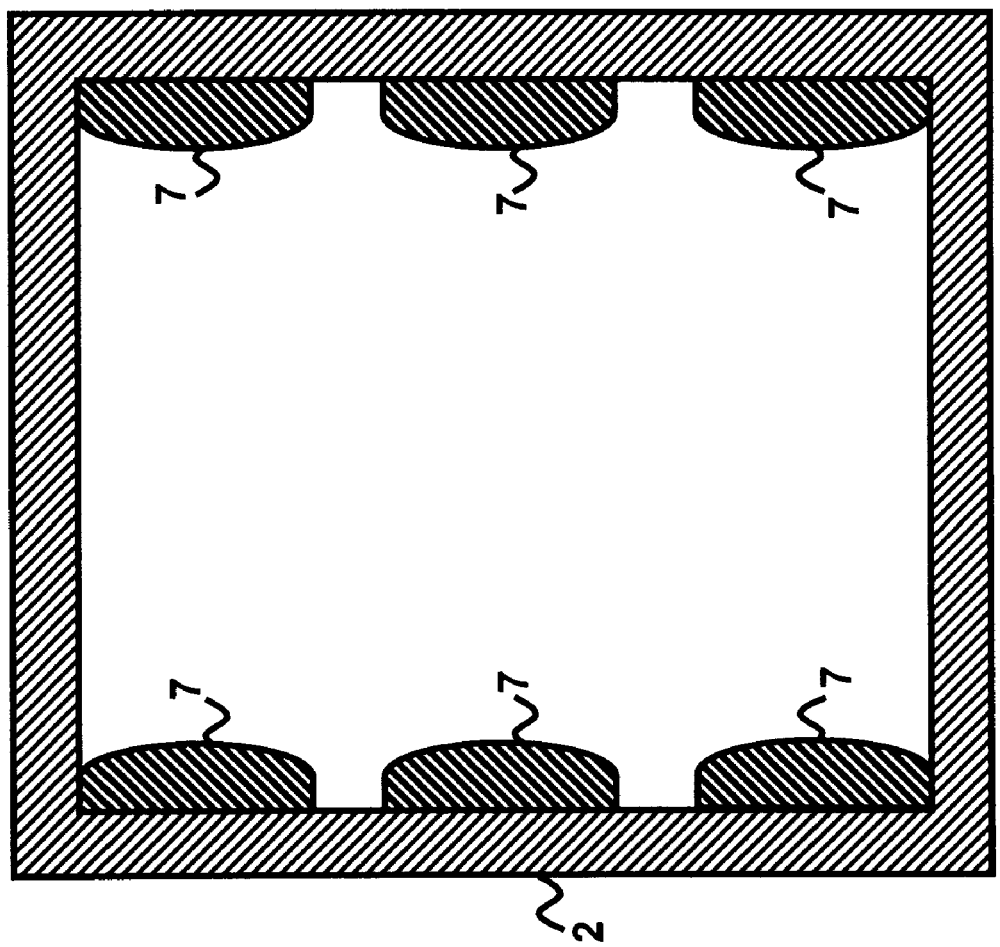
Figure 18:
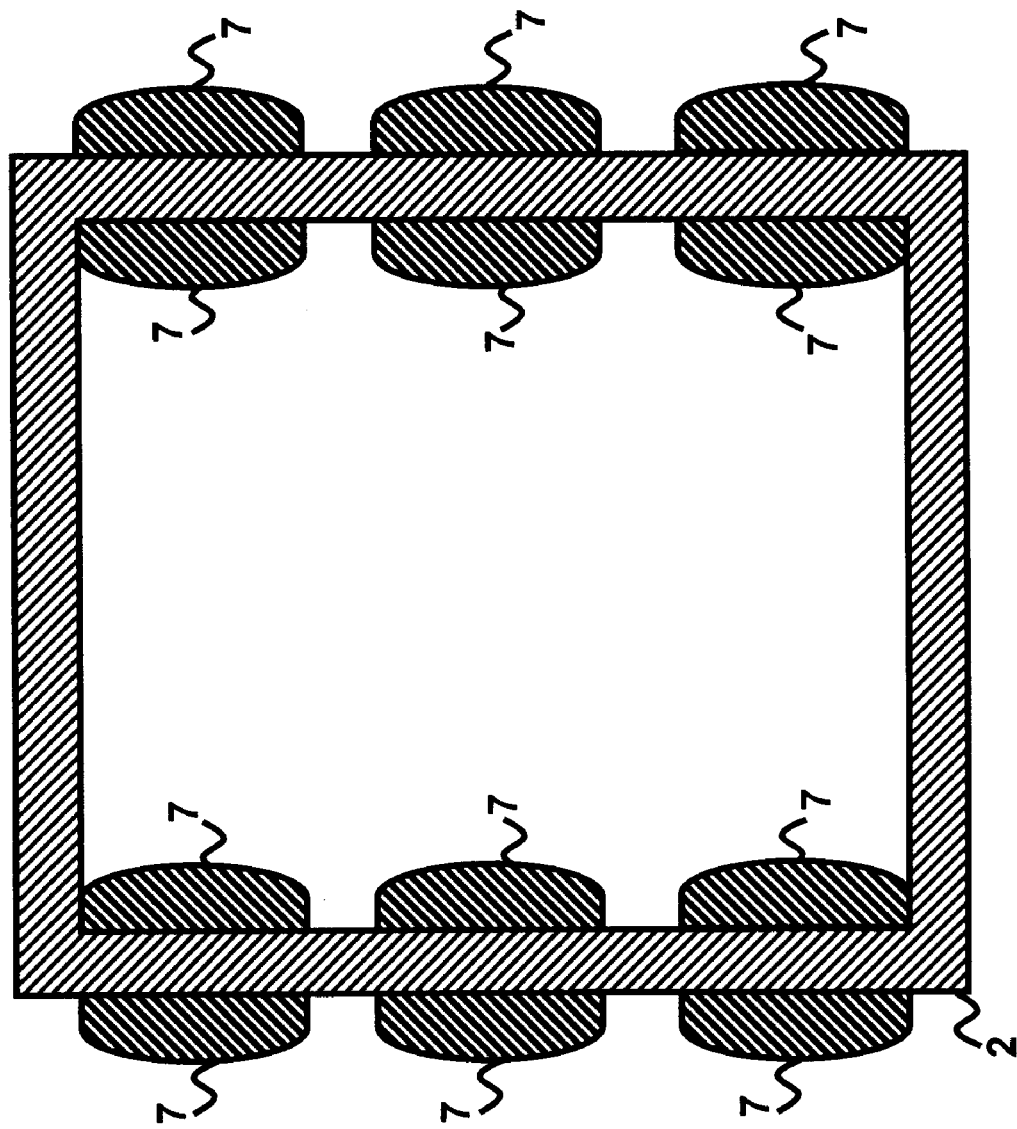
Figure 19:
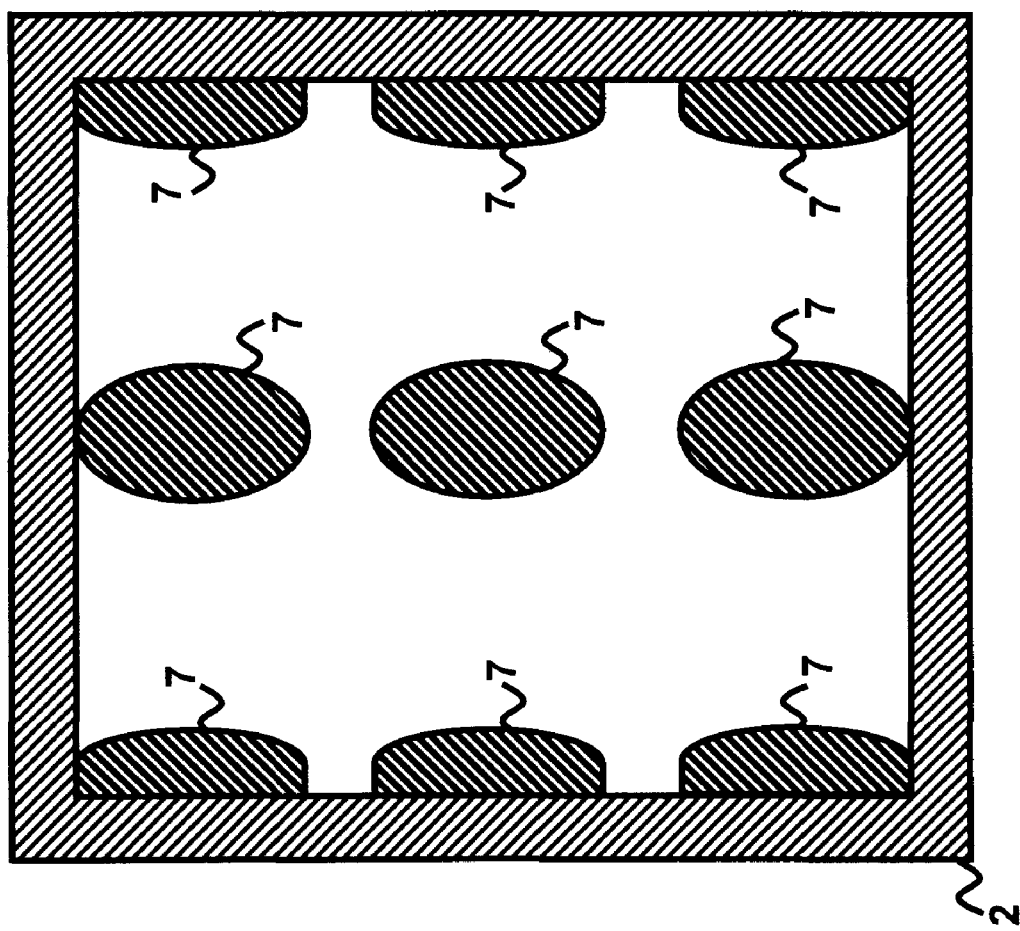
Figure 20:
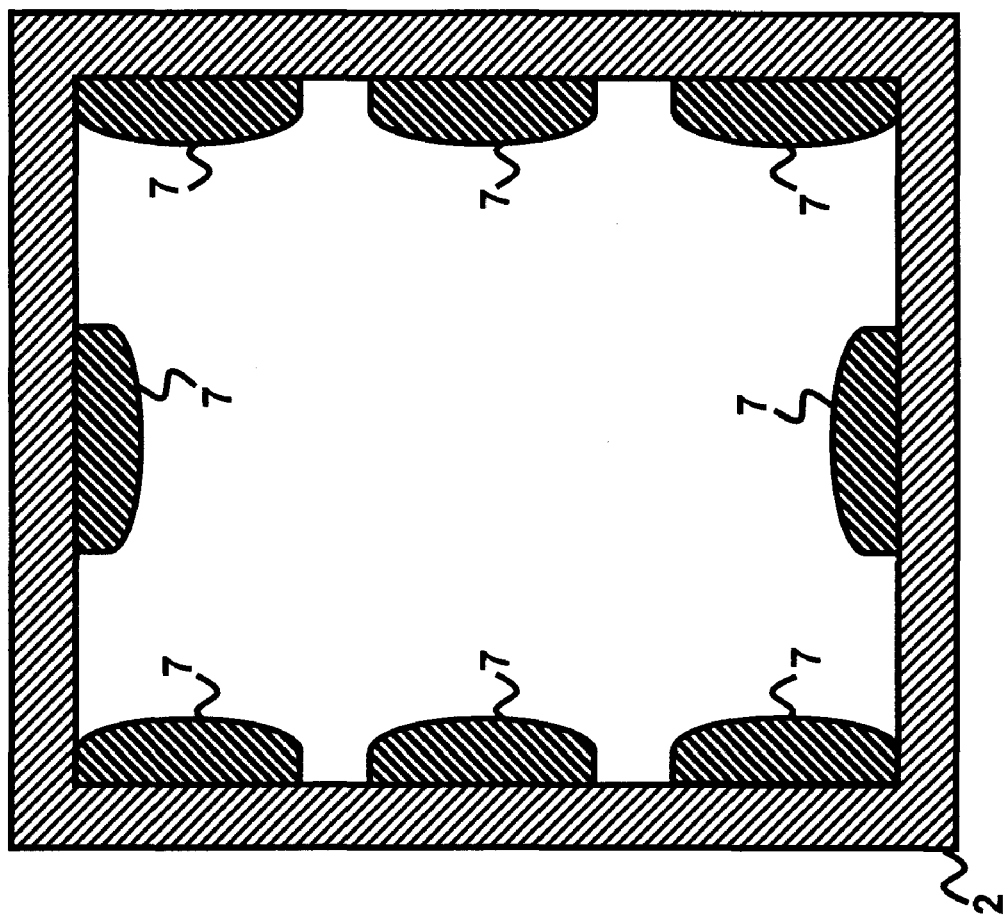
Figure 21:
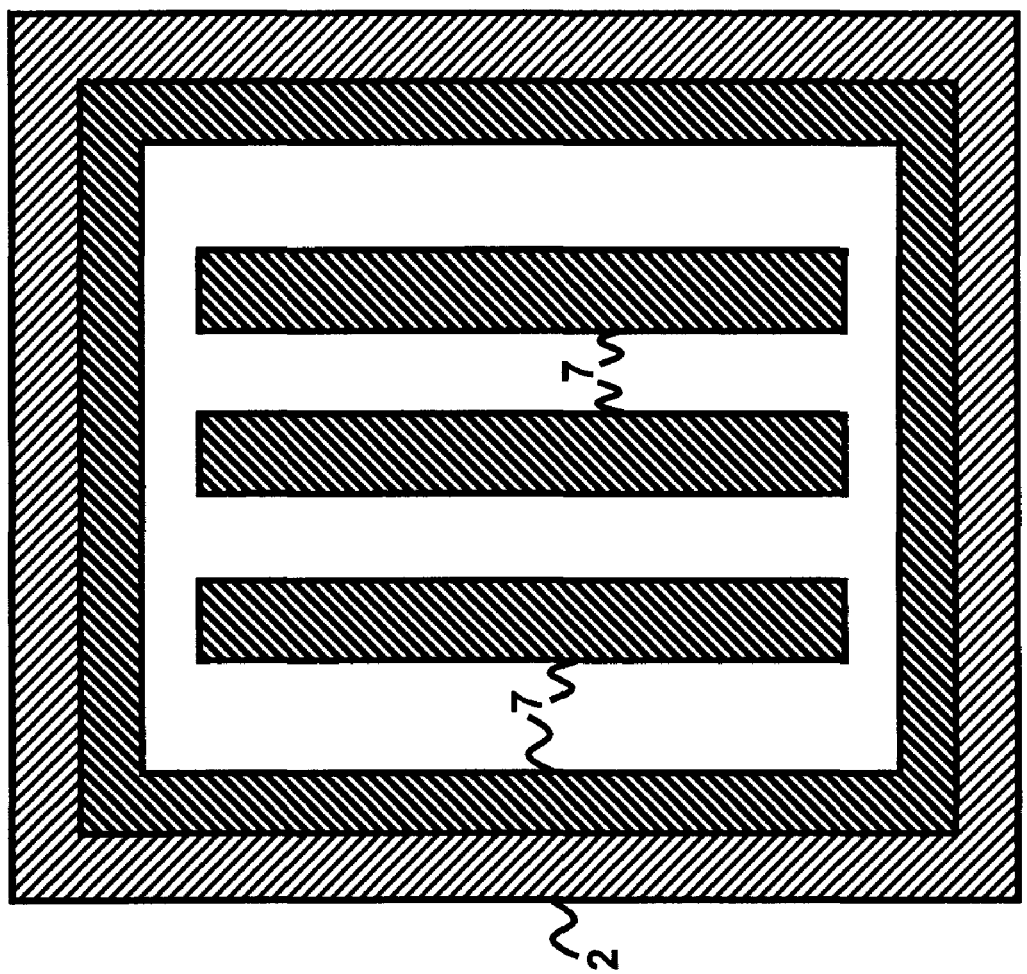

FIGS. 13 and 14 illustrate a latchup robust SCR (i.e., a thyristor) structure 40 according to an embodiment of the invention, which is similarly configured to the polysilicon gated p-n diode structure 30 of FIGS. 11 and 12. In the SCR 40, the use of a DT structure 2 or TI structure 12 allows for the formation of a SCR 40 with different voltage turn-on trigger and holding conditions. The SCR 40 can be utilized for ESD protection of circuits. Whereas it is normally desired to characterize latchup using a pnpn element, the SCR 40 can also be used as a protection network. In fact, as further described below, data from FIGS. 22 through 26 demonstrate the operability of a pnp-DT-n SCR ESD network for ESD protection in CMOS or BiCMOS SiGe technology.

FIGS. 15 to 21 are top view schematic diagrams of the DT structure 2 and masked sub-collector 7 with and without ballasting according to the embodiments of the invention. Ballasting provides higher resistance between the low resistance regions; i.e., ballasting is the high resistance regions between the low resistance regions.

Figure 22:
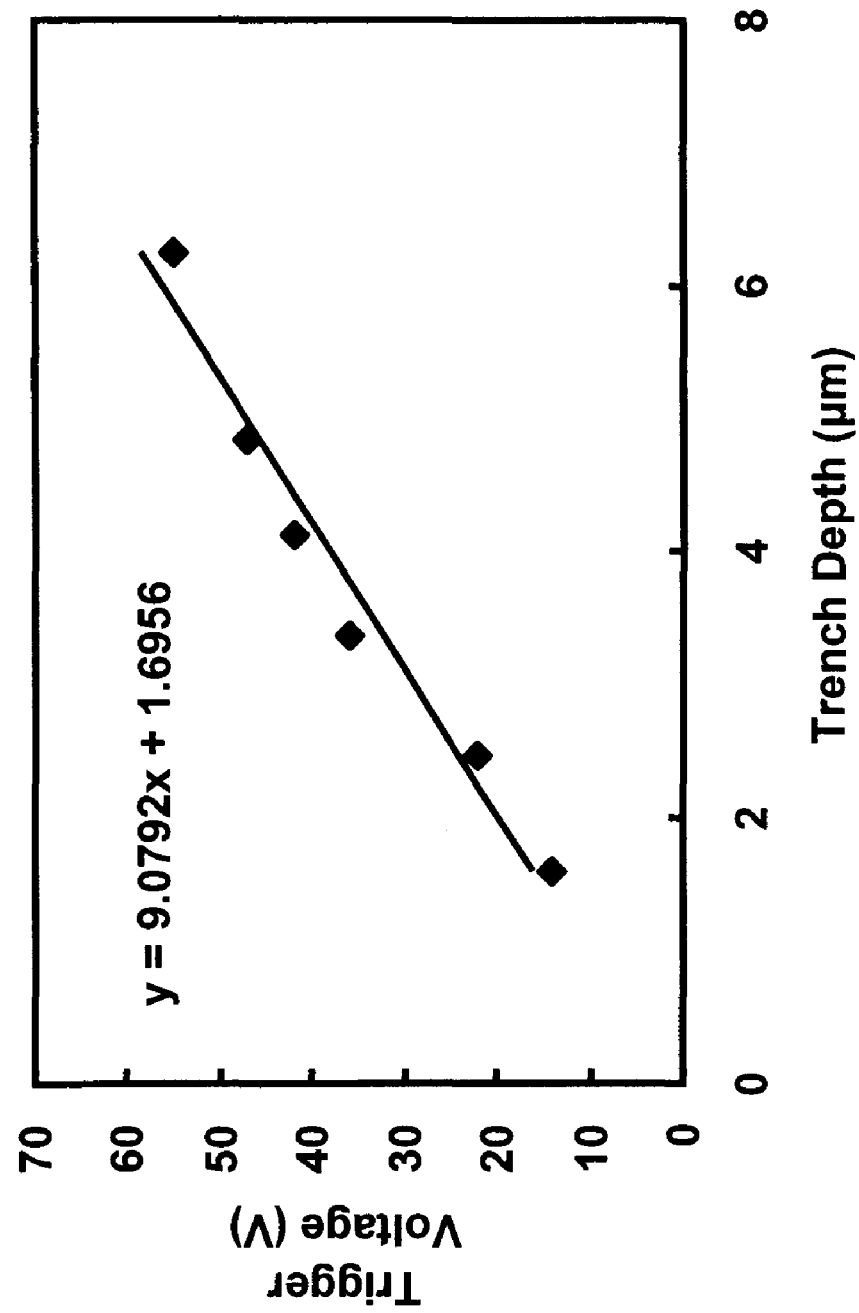
FIG. 22 is a graphical representation illustrating experimental results of the trigger voltage of a pnpn latchup structure in CMOS and BiCMOS SiGe devices as a function of the depth of a deep trench structure according to an embodiment of the invention.

FIG. 22 illustrates the experimental results of the trigger voltage of a pnpn latchup structure in CMOS and BiCMOS SiGe devices as a function of the depth of a DT structure 2 according to the embodiments of the invention. The experimental results demonstrate the operability of increasing the trigger condition as a function of trench depth. Thus, the addition of the DT structure 2 in forming a pnp-DT-n structure provides improved latchup robustness.

Figure 23:
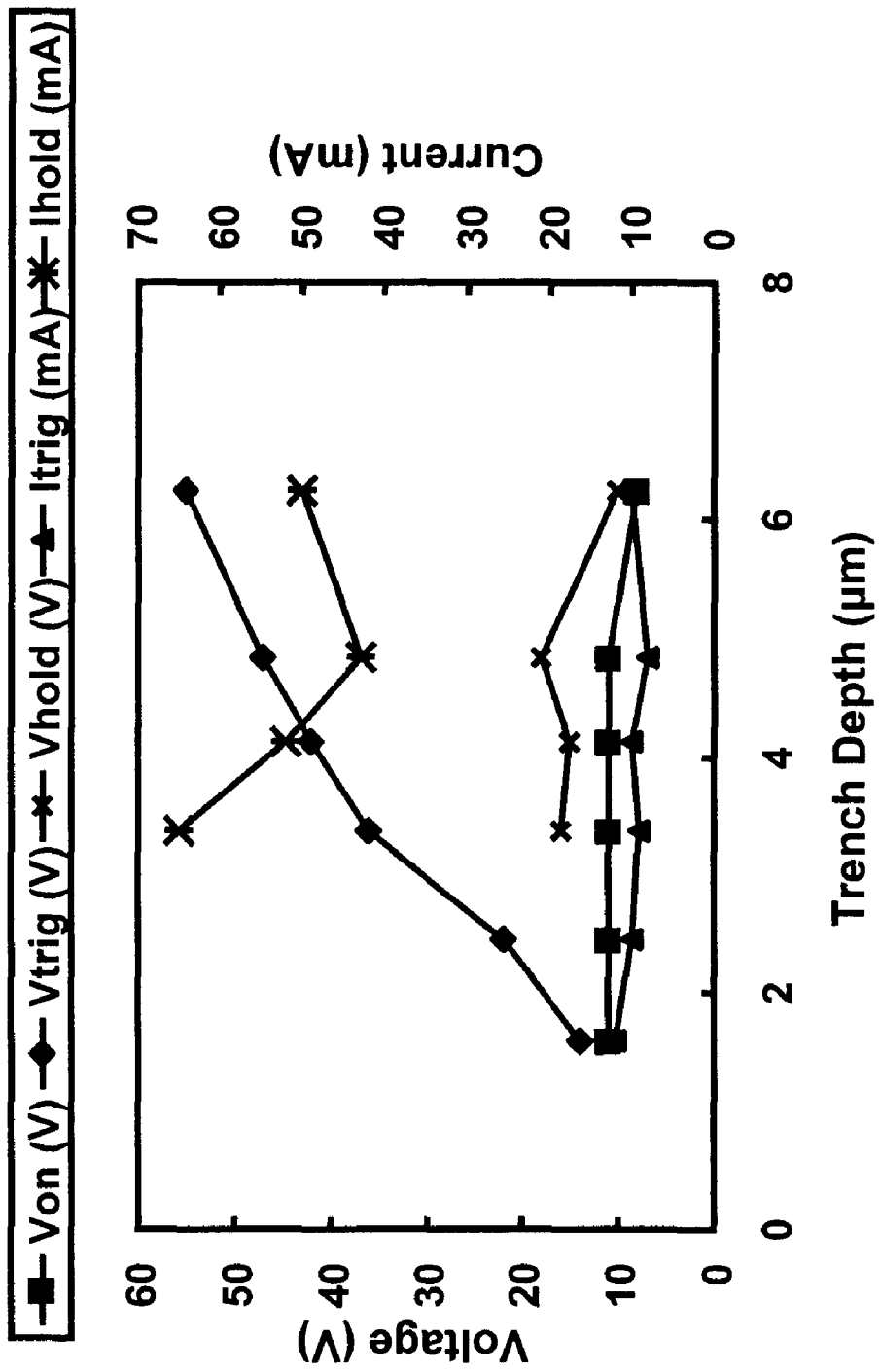
FIG. 23 is a graphical representation illustrating experimental results of the voltage and current as a function of the depth of a deep trench structure of a pnpn latchup structure for trigger and holding conditions in CMOS and BiCMOS SiGe devices according to an embodiment of the invention.

FIG. 23 illustrates the experimental results of the voltage and current as a function of the depth of a DT structure 2 of a pnpn latchup structure for trigger and holding conditions in CMOS and BiCMOS SiGe devices according to the embodiments of the invention. FIG. 23 demonstrates that the operability of the pnp-DT-n structure results in improved latchup robustness for CMOS technology or BiCMOS SiGe technology.

Figure 24:
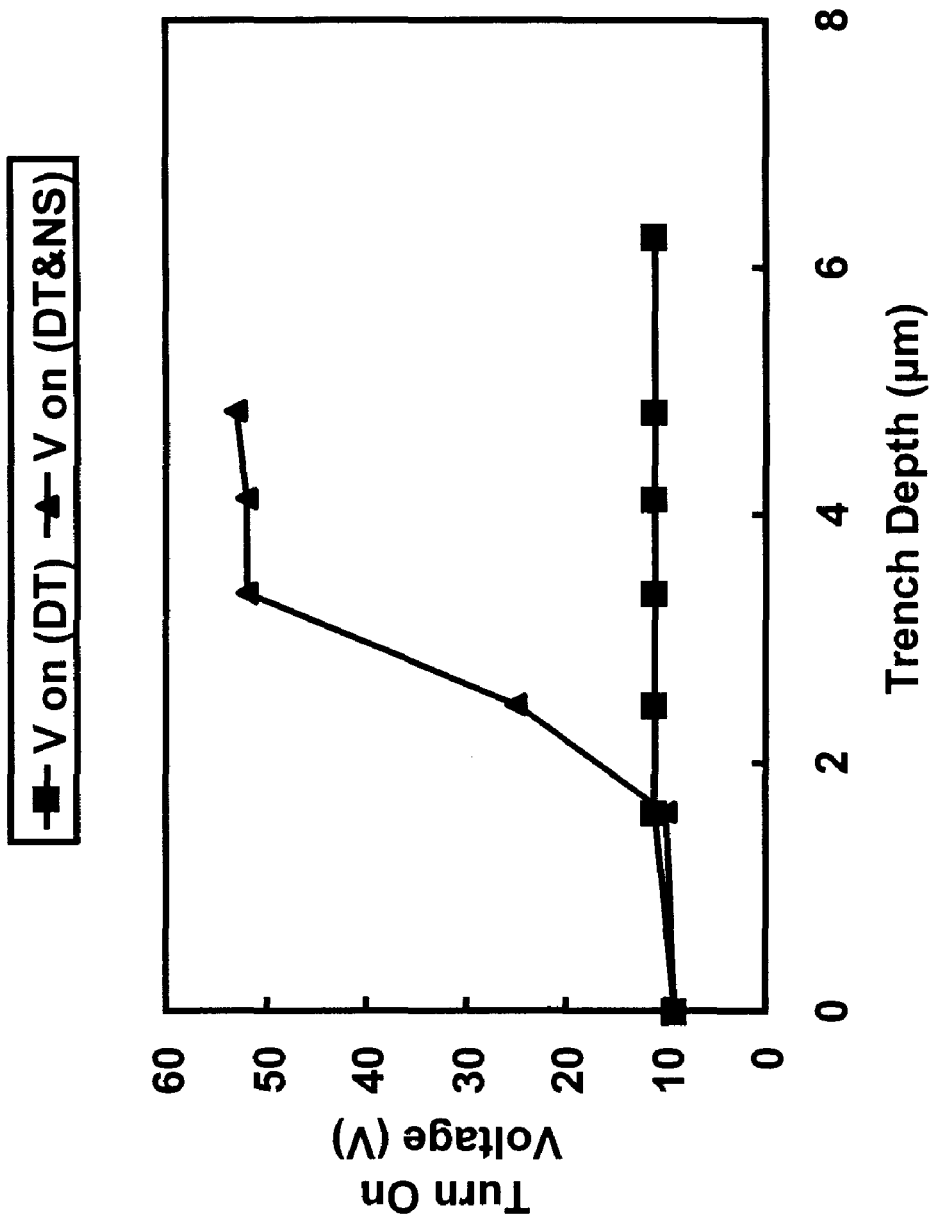
FIG. 24 is a graphical representation illustrating the turn-on voltage as a function of the trench depth and sub-collector implant in a pnpn latchup structure in CMOS and BiCMOS SiGe devices according to an embodiment of the invention.

FIG. 24 illustrates the turn-on voltage as a function of the trench depth and sub-collector implant in a pnpn latchup structure in CMOS and BiCMOS SiGe devices according to the embodiments of the invention. In the plot of FIG. 24, the experimental result shows that the turn-on voltage is a mechanism independent of the trench depth. In FIG. 23, it is evident that the trigger condition improves with trench depth leading to an improved latchup robust technology. In FIG. 24, the "turn-on" voltage does not demonstrate an improvement with the inventive DT structure 2 in the pnp-DT-n structure. This indicates that the turn-on voltage mechanism is not related to the substrate 4, but rather on the n-well region 5 at which the DT structure 2 serves as a perimeter sidewall to.

In the case of the sub-collector 7 implanted in the n-well region 5, experimental results indicate that the turn-on mechanism voltage is not improved with DT structures 2 on the order of 1–2 $\mu$m deep. Hence, the turn-on mechanism, in accordance with the embodiments of the invention, demonstrates that the turn-on effect is a perimeter effect at the edge of the n-well region 5. When the DT structure 2 penetrates to the depth of the sub-collector 7, the turn-on voltage increases. As the DT structure 2 becomes deeper, the turn-on voltage increases until the DT structure 2 penetrates beyond the depth of the sub-collector 7.

Accordingly, the embodiments of the invention, as demonstrated by the experimental results, indicate that the turn-on mechanisms do not improve with a deep trench in the standard conventional n-well regions; the turn-on mechanism voltage does not improve with a standard conventional sub-collector implant with no trench perimeter; the turn-on mechanism voltage does not improve with a standard sub-collector implant and a trench structure that does not penetrate into the sub-collector top surface; and that the turn-on mechanism voltage does improve with a sub-collector implant 7 and a DT structure 2 that does penetrate into the top surface of the sub-collector 7.

Figure 25:
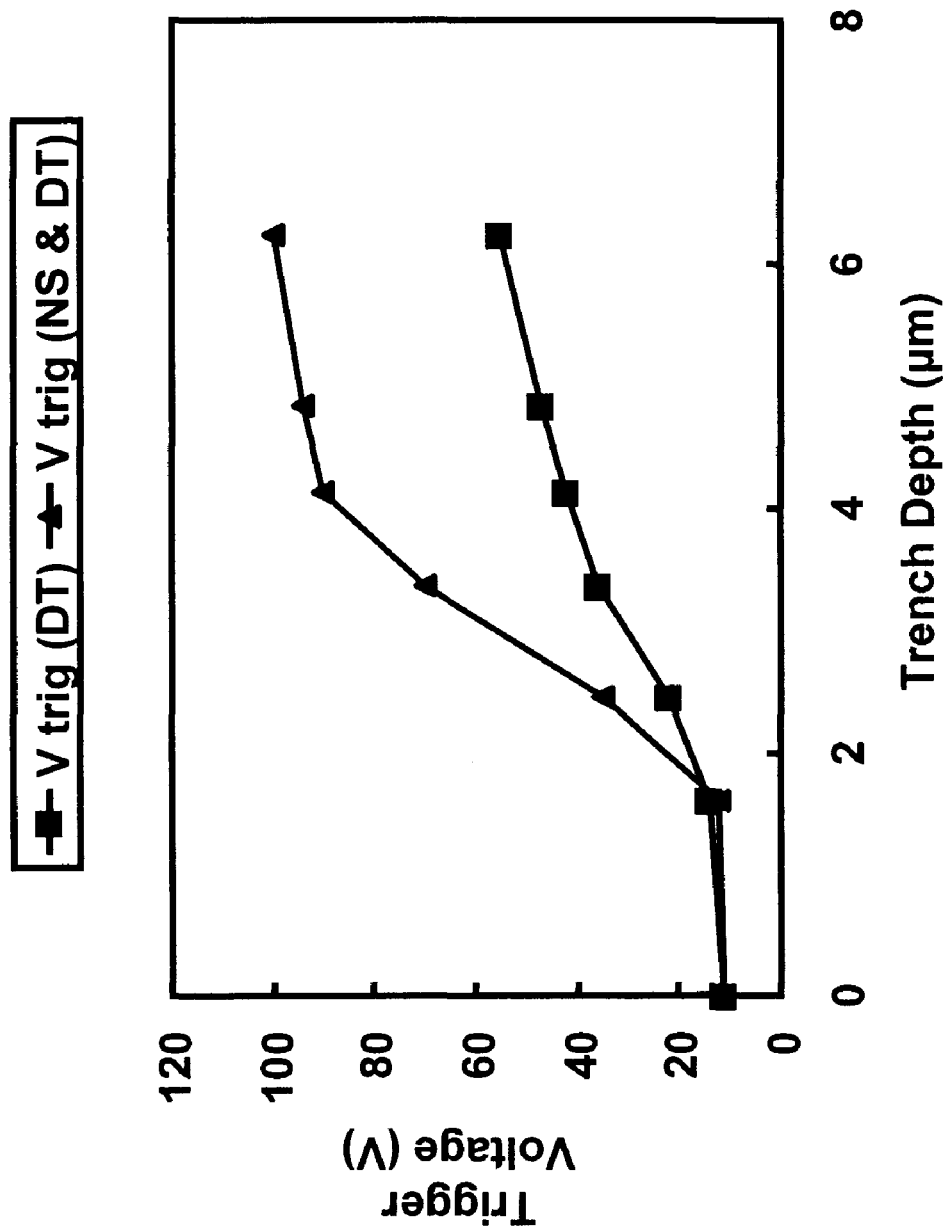
FIG. 25 is a graphical representation illustrating the trigger voltage as a function of the trench depth and sub-collector implant in a pnpn latchup structure in CMOS and BiCMOS SiGe devices according to an embodiment of the invention.

FIG. 25 illustrates the trigger voltage as a function of the trench depth and sub-collector implant in a pnpn latchup structure in CMOS and BiCMOS SiGe devices according to the embodiments of the invention. Here, the results demonstrate that the trigger voltage has an additional improvement with the addition of the sub-collector implant 7. Accordingly, the embodiments of the invention, as demonstrated by the experimental results, indicate that the trigger voltage does improve with an increase in the trench depth in the n-well region 5; the trigger voltage mechanism voltage does not improve with a standard conventional sub-collector implant with no trench perimeter; the trigger condition voltage does not improve with a standard conventional sub-collector implant and a trench structure that does not penetrate into the sub-collector top surface; the trigger voltage does improve with a sub-collector implant 7 and a DT structure 2 that does penetrate into the top surface of the sub-collector 7; the trigger voltage does improve with a sub-collector implant 7 and a DT structure 2 that penetrates beyond the top surface of the sub-collector 7; the trigger voltage does not significantly improve with a sub-collector implant 7 and a DT structure 2 that penetrates beyond the bottom surface of the sub-collector 7.

Figure 26:
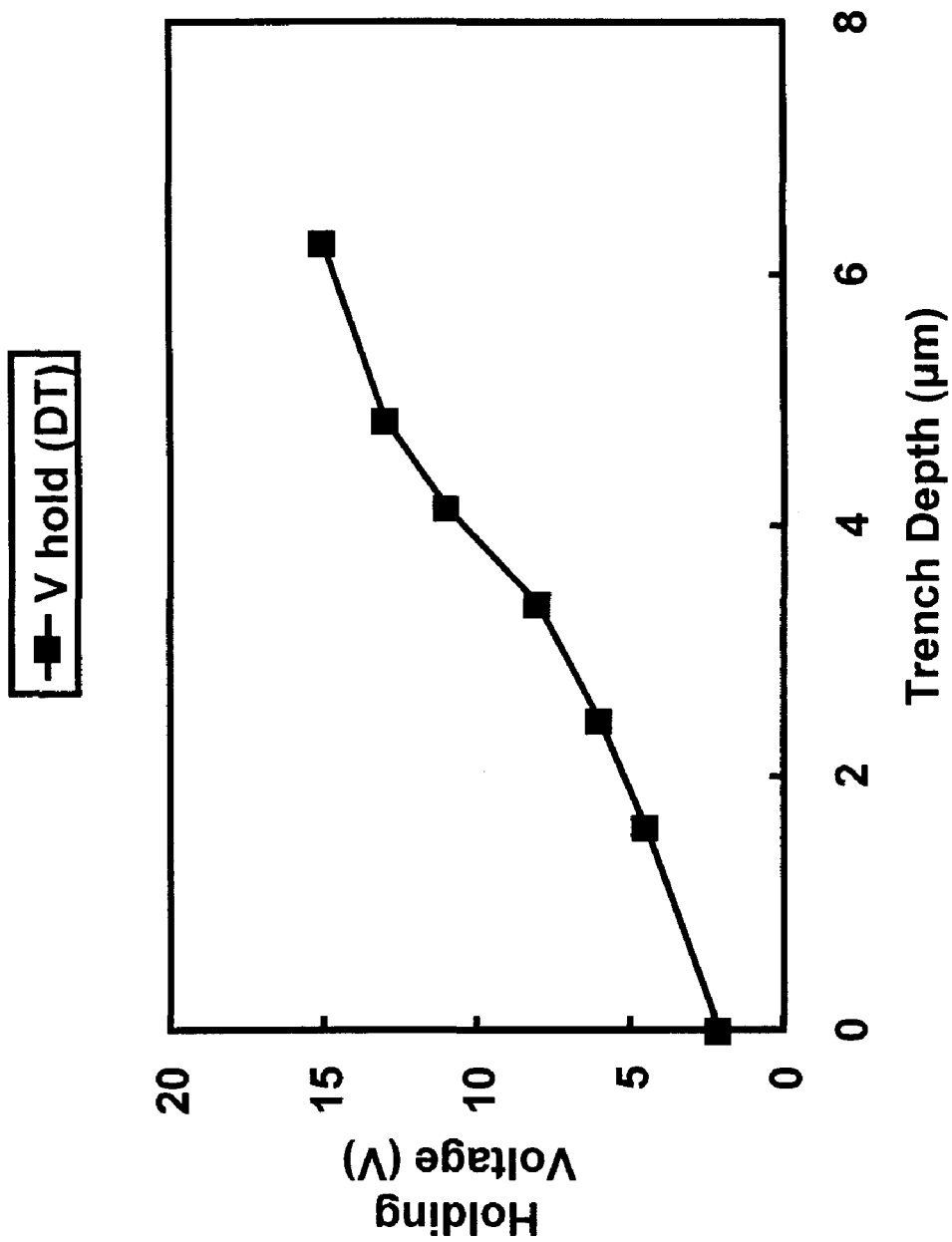
FIGS. 26 and 27 are graphical representations illustrating the holding voltage as a function of the trench depth and sub-collector implant in a pnpn latchup structure in CMOS and BiCMOS SiGe devices according to an embodiment of the invention.
Figure 27:
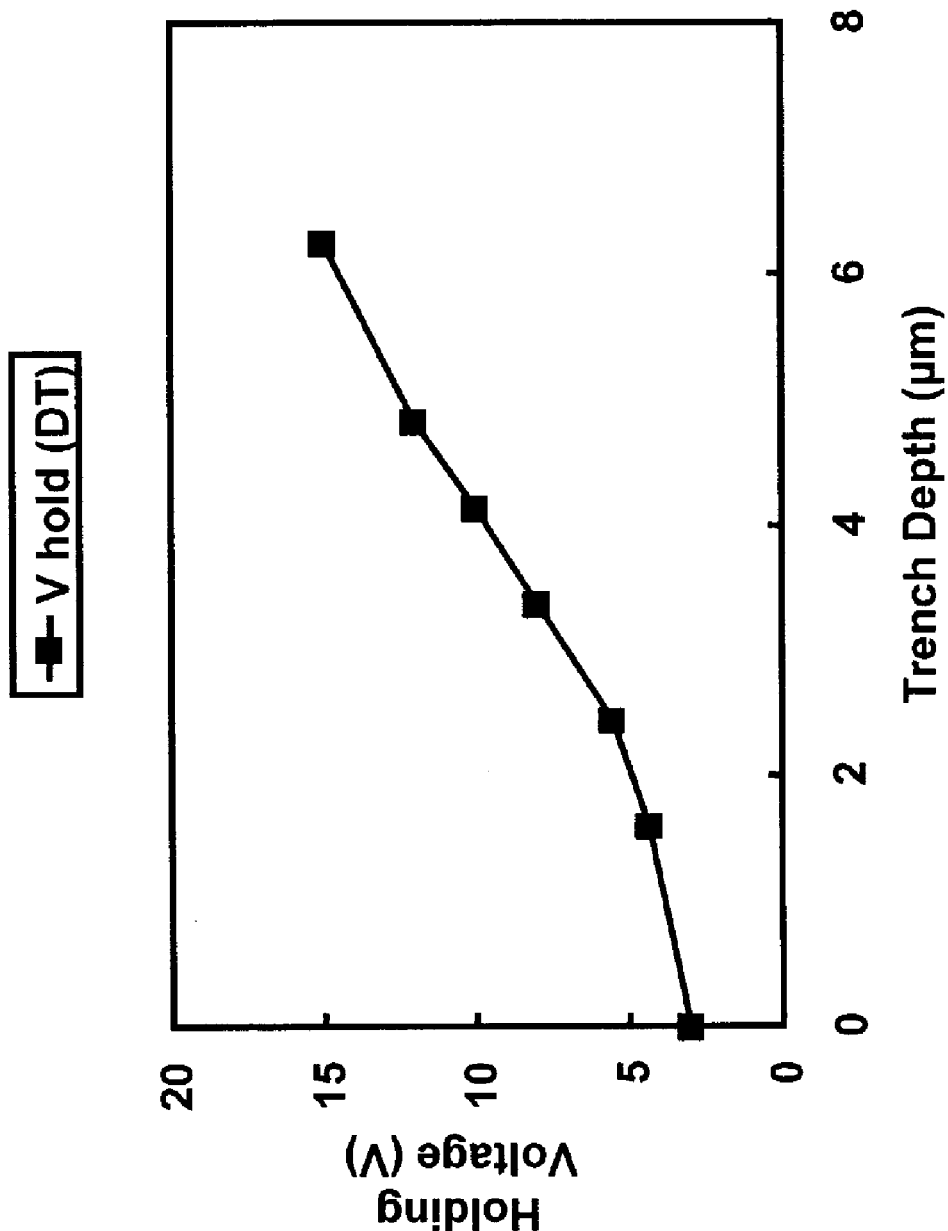

FIGS. 26 and 27 illustrate the holding voltage as a function of the trench depth and sub-collector implant in a pnpn latchup structure in CMOS and BiCMOS SiGe devices according to the embodiments of the invention. These experimental results demonstrate the operability and improvement of the latchup robustness with increased trench depth as provided by the embodiments of the invention.

From the various embodiments described above and from the corresponding experimental results, it is clear that there are several ways of implementing the masked sub-collector implant 7. Moreover, it is evident from the experimental results that the sub-collector implant 7 must exist at least partially on the sidewall edge of the DT structure 2 to provide latchup robustness improvements. From this, in all of the aforementioned structures, the sub-collector region 7 can sub-tend across the entire device but not necessarily in order to provide the latchup robustness improvement. Placement of the sub-collector 7 under the entire center portion of the structure can limit the design point of the p-diode, p-channel or polysilicon structure elements of the full structure. Hence, it is an advantage in some cases to place the sub-collector implant 7 on the sidewall only, but does not preclude usage through the entire region.

Additionally, from the experimental results, it is also evident that latchup instability is hampered at high voltages due to the low lateral resistance across the structure. Lateral latchup stability can be improved by providing an embodiment with variation in the x-y plane along the surface to introduce lateral ballasting within the structural elements. Stability can be achieved using a thin sidewall implant region of sufficiently high resistance, gaps introduced by masking, comb structures, or other patterns which provide non-uniform doping along the lateral length of the structure. Hence, the embodiments of the invention, and the experimental results thereof, demonstrate that lateral ballasting can be used to further improve the latchup robustness of the conventional structures. Using the masked sub-collector implant 7 as opposed to a full implant in the interior of the DT structure 2 provides this advantage which is not achievable in the conventional continuous implanted sub-collectors.

As mentioned, there are multiple means of providing the masking of the sub-collector implant 7. There are standard practices which use positive or negative tone resists masks to provide masking operation. In the case of the edge implant, it is also possible to provide self—alignment between the DT structure 2 and sidewall sub-collector implant 7 using a hybrid resist material comprising of positive and negative tone resist properties. In this resist type, the trench mask can be used to provide the mask for the sub-collector implant 7. In the hybrid resist material, a ring will be formed at the edge of the deep trench shape allowing implantation only at the edge of the DT structure 2. This provides a self-aligned implant to the edge of the DT structure 2 or TI structure 12.

Figure 28:
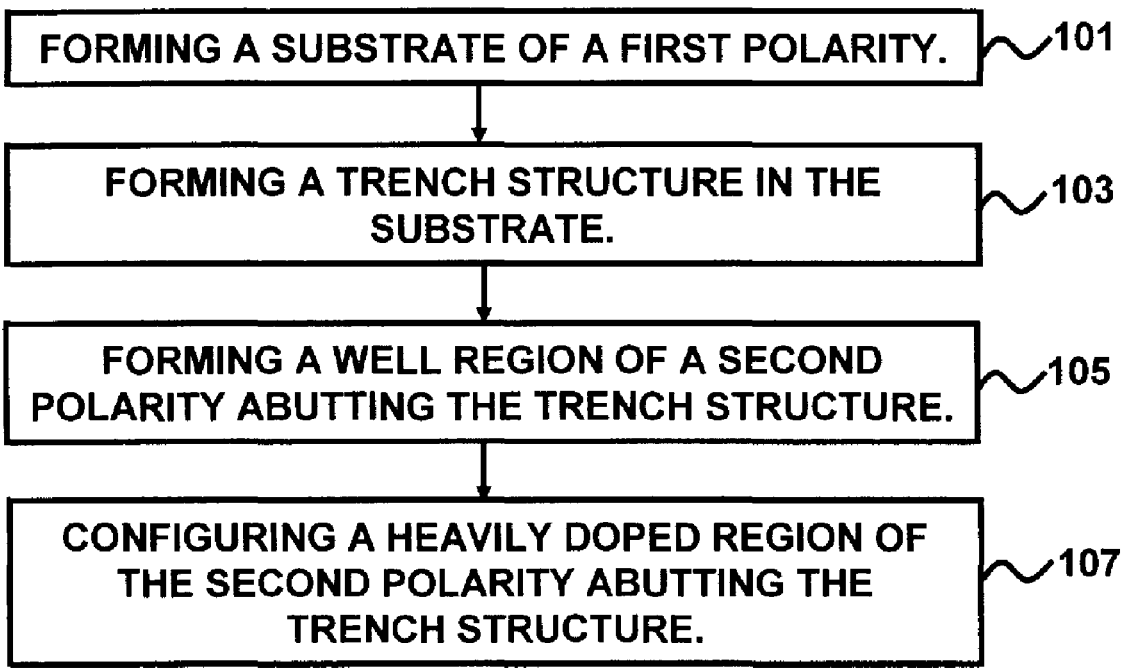
FIG. 28 is a flow diagram illustrating a preferred method according to a first embodiment of the invention.

Another embodiment of the invention, as shown in the flow diagram of FIG. 28, provides a method of forming an integrated circuit, wherein the method comprises forming (101) a substrate 4 of a first polarity; forming (103) a trench structure 2, 12 in the substrate 4; forming (105) a well region 5 (having a doping concentration on the order of $1\times10^{15}$ per $cm^3$) of a second polarity abutting (i.e., contacting) the trench structure 2; and configuring (107) a heavily doped region 7 (having a doping concentration on the order of $1\times10^{20}$ per $cm^3$) of the second polarity abutting the trench structure 2, wherein the heavily doped region 7 suppresses latch-up in the integrated circuit, and wherein the heavily doped region comprises a sub-collector region 7. The method further comprises configuring the trench structure as a deep trench structure 2. Additionally, the method further comprises forming a p+ anode 6 in the well region 5; forming a n+ cathode 11 in the well region 5; and forming a gate structure 8 over the p+ anode 6 and n+ cathode 11.

In one embodiment, the integrated circuit comprises a STI region 1, wherein the trench structure comprises a DT structure 2 having a DT depth and a DT width, wherein the DT depth is at least twice as large as the DT width, wherein the STI region 1 is over the DT structure 2, and wherein an aspect ratio of the depth to the width is at least 2.85. In another embodiment, the integrated circuit comprises a STI region 1, wherein the trench structure comprises a TI region 12 having a TI depth and a TI width, wherein the TI depth is at least twice as large as the TI width, wherein the TI region 12 traverses (i.e., cuts through) the STI region 1, and wherein an aspect ratio of the TI depth to the TI width is at least 2.5.

Figure 29:
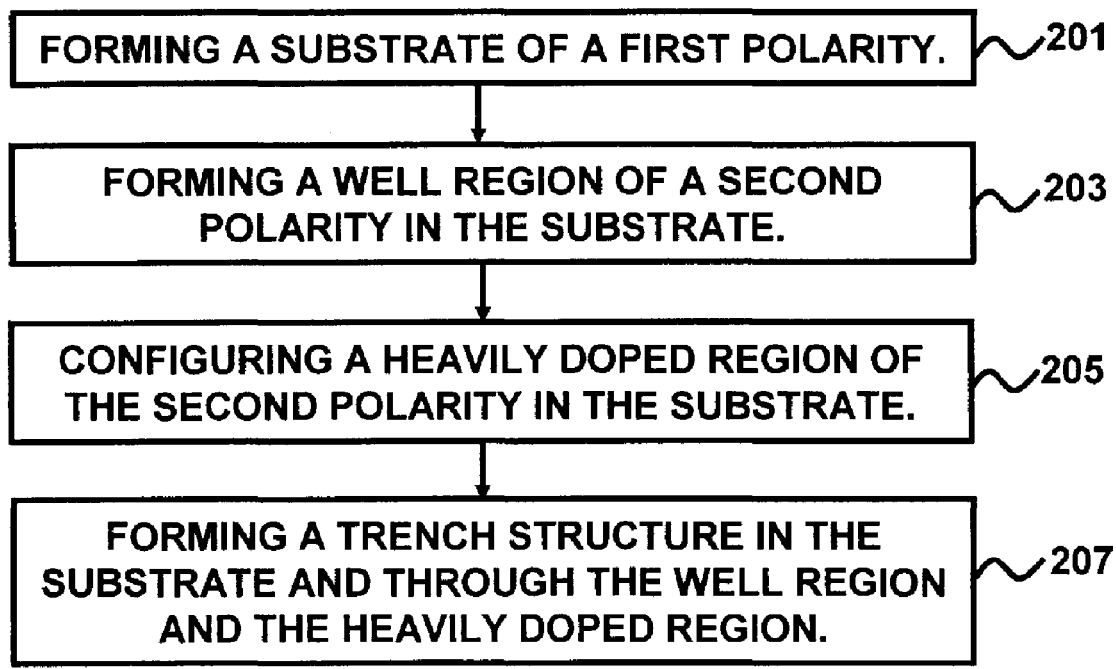
FIG. 29 is a flow diagram illustrating a preferred method according to a second embodiment of the invention.

Another aspect of the invention, as shown in the flow diagram of FIG. 29, provides a method of forming an integrated circuit, wherein the method comprises forming (201) a substrate 4 of a first polarity; forming (203) a well region 5 (having a doping concentration on the order of $1\times10^{15}$ per $cm^3$) of a second polarity in the substrate 4; configuring (205) a heavily doped region 7 (having a doping concentration on the order of $1\times10^{20}$ per $cm^3$) of the second polarity in the substrate 4; and forming (207) a trench structure 12 in the substrate 4 and through the well region 5 and the heavily doped region 7, wherein the trench structure 12 and heavily doped region 7 suppresses latch-up in the integrated circuit, and wherein the heavily doped region comprises a sub-collector region 7. The method further comprises configuring the trench structure as a trench isolation structure 12. Additionally, the method further comprises forming a p+ anode 6 in the well region 5; forming a n+ cathode 11 in the well region 5; and forming a gate structure 8 over the p+ anode 6 and n+ cathode 11.

The embodiments of the invention improve the latchup robustness in CMOS devices. A trench isolation region 12 or deep trench structure 2 and a highly doped region, such as a n-type sub-collector 7, are formed in proximity to a CMOS device. A portion of the trench sidewall on the device side of the trench 2, 12 is in contact with the high dopant region 7. The high dopant region 7 is formed below the CMOS device area and can be configured as a continuous or masked dopant region 7. The trench 2, 12 and high dopant region 7 prevent carriers from going under the trench 2, 12, thus $V_{turnon}$ is increased and the CMOS device's latchup robustness is improved. The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. An integrated circuit comprising:
   a substrate of a first polarity;
   a trench structure in said substrate;
   a well region of a second polarity abutting said trench structure;
   a heavily doped region of said second polarity abutting said trench structure; and
   a shallow trench isolation region, wherein said trench structure comprises a deep trench structure having a depth and a width, wherein said depth is at least twice as large as said width, and wherein said shallow trench isolation region is over said deep trench structure,
   wherein said heavily doped region having a dopant concentration greater than a dopant concentration of said well region, and wherein said heavily doped region is adapted to suppress latch-up in said integrated circuit.

2. The integrated circuit of claim 1, wherein said heavily doped region comprises a sub-collector region.

3. The integrated circuit of claim 1, wherein an aspect ratio of said depth to said width is at least 2.85.

4. The integrated circuit of claim 1, further comprising a shallow trench isolation region, wherein said trench structure comprises a trench isolation region having a depth and a width, wherein said depth is at least twice as large as said width, and wherein said trench isolation region traverses said shallow trench isolation region.

5. The integrated circuit of claim 4, wherein an aspect ratio of said depth to said width is at least 2.5.

6. The integrated circuit of claim 1, further comprising:
a p+ anode in said well region;
a n+ cathode in said well region; and
a gate structure over said p+ anode and said n+ cathode.

7. A complementary metal oxide semiconductor (CMOS) device, said CMOS device comprising:
a p-type substrate;
shallow trench isolation (STI) regions in said p-type substrate;
p-type diffusion regions in said p-type substrate and in between successive ones of said STI regions:
a n-type retrograde well in said p-type substrate;
a deep trench isolation region bounding said p-type diffusion regions and said n-type retrograde well; and
a n-type sub-collector adjacent to a sidewall of said deep trench isolation region and below said STI regions,
wherein said p-type diffusion regions, said n-type retrograde well, and said p-type substrate form pnp parasitic bipolar transistor in said CMOS device, and
wherein said deep trench isolation region and said n-type sub-collector are adapted to suppress latch-tip in said CMOS device that is caused by said pnp parasitic bipolar transistor.

8. The CMOS device of claim 6, wherein said n-type sub-collector comprises a uniform dopant layer.

9. The CMOS device of claim 6, wherein said n-type sub-collector comprises a discontinuous dopant layer.

10. The CMOS device claim 6, wherein said n-type sub-collector is adjacent to a lower surface of said n-type retrograde well.

11. The CMOS device of claim 6, wherein said deep trench isolation region comprises a depth and a width, wherein said depth is at least twice as large as said width, and wherein said shallow trench isolation regions are over said deep trench isolation region.

* * * * *